(12) United States Patent
Tsuji

(10) Patent No.: US 8,637,886 B2
(45) Date of Patent: Jan. 28, 2014

(54) SEMICONDUCTOR LIGHT EMITTING ELEMENT

(75) Inventor: Yukie Tsuji, Ichihara (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 13/369,096

(22) Filed: Feb. 8, 2012

(65) Prior Publication Data

US 2012/0199861 A1    Aug. 9, 2012

(30) Foreign Application Priority Data

Feb. 9, 2011 (JP) ................... 2011-026136

(51) Int. Cl.
*H01L 33/00* (2010.01)

(52) U.S. Cl.
USPC ......... 257/98; 257/99; 257/100; 257/E33.072

(58) Field of Classification Search
USPC .............................. 257/98–100; 313/498–499
See application file for complete search history.

(56) References Cited

U.S. PATENT DOCUMENTS

| | | | |
|---|---|---|---|
| 2006/0231854 A1 * | 10/2006 | Chae et al. ............. | 257/99 |
| 2007/0262331 A1 | 11/2007 | Ogihara et al. | |
| 2009/0078951 A1 * | 3/2009 | Miki et al. ............. | 257/98 |
| 2011/0018024 A1 | 1/2011 | Fukshima et al. | |

FOREIGN PATENT DOCUMENTS

| | | |
|---|---|---|
| JP | 2006-303430 A | 11/2006 |
| JP | 2007-013045 A | 1/2007 |
| JP | 2007-294605 A | 11/2007 |
| JP | 2009-260316 A | 11/2009 |
| JP | 2010-087282 A | 4/2010 |

* cited by examiner

*Primary Examiner* — Matthew W Such
*Assistant Examiner* — Frederick B Hargrove
(74) *Attorney, Agent, or Firm* — Sughrue Mion, PLLC

(57) ABSTRACT

A semiconductor light emitting element includes: a light emitting layer and a p-type semiconductor layer laminated on an n-type semiconductor layer; a transparent conductive layer laminated on the p-type semiconductor layer; a transparent insulating layer laminated on the transparent conductive layer and the exposed n-type semiconductor layer, the transparent insulating layer having plural tapered through-holes formed therein; a p-electrode formed on the transparent conductive layer with the transparent insulating layer interposed therebetween, the p-electrode being connected to the transparent conductive layer via the through-holes provided for the transparent insulating layer; and an n-electrode formed on the n-type semiconductor layer with the transparent insulating layer interposed therebetween, the n-electrode being connected to the n-type semiconductor layer via the through-holes provided for the transparent insulating layer.

14 Claims, 9 Drawing Sheets

SEMICONDUCTOR LIGHT EMITTING ELEMENT

CROSS REFERENCE TO RELATED APPLICATIONS

This application is based on and claims priority under 35 USC §119 from Japanese Patent Application No. 2011-26136 filed Feb. 9, 2011.

BACKGROUND

1. Technical Field

The present invention relates to a semiconductor light emitting element.

2. Related Art

A semiconductor light emitting element using a light emitting layer, such as GaInN, AlInGaP, GaAlAs or the like, is employed as a light emitting diode having high light emission efficiency. A semiconductor light emitting element using a group III nitride semiconductor such as GaInN, for example, is configured by forming group III nitride semiconductor layers including a light emitting layer on a substrate of sapphire or the like, for example. As such a semiconductor light emitting element, there is one which emits light outputted from the light emitting layer to the outside through the substrate by mounting the semiconductor light emitting element on a circuit board by flip-chip bonding.

Japanese Patent Application Laid-Open Publication No. 2006-303430 discloses a flip-chip nitride semiconductor light emitting element having p-type and n-type nitride semiconductor layers and an active layer formed therebetween, the light emitting element including: an ohmic contact layer formed on the p-type nitride semiconductor layer; a conductive oxide layer with light transparency formed on the ohmic contact layer; and a metal layer with high reflectivity formed on the conductive oxide layer.

Japanese Patent Application Laid-Open Publication No. 2009-260316 discloses a semiconductor light emitting element in which an n-type semiconductor layer, a light emitting layer and a p-type semiconductor layer are laminated and a transparent conductive layer and a reflective film are further laminated on the p-type semiconductor layer, the reflective film including: a transparent layer having light transparency at a light emission wavelength of the light emitting layer, the transparent layer being laminated on the transparent conductive layer; and a metal layer with a high reflectance laminated on the transparent layer, wherein the semiconductor light emitting element is provided with a metal portion penetrating the transparent layer to electrically connect the transparent conductive layer to the metal layer, and thereby the metal layer is used as an electrode to energize the light emitting layer.

SUMMARY

An object of the present invention is to improve light extraction efficiency from a semiconductor light emitting element and to suppress the occurrence of cracks at an electrode provided for the semiconductor light emitting element.

According to an aspect of the present invention, there is provided a semiconductor light emitting element including: a first semiconductor layer composed of a III-V semiconductor having a first conductivity type; a light emitting layer provided on the first semiconductor layer so as to be in contact with the first semiconductor layer, the light emitting layer being composed of a III-V semiconductor and emitting light by being energized; a second semiconductor layer provided on the light emitting layer so as to be in contact with the light emitting layer, the second semiconductor layer being composed of a III-V semiconductor having a second conductivity type opposite to the first conductivity type; a transparent conductive layer composed of a material that is conductive and transparent to light outputted from the light emitting layer, the transparent conductive layer being laminated on the second semiconductor layer; a transparent insulating layer composed of a material that is insulative and transparent to light outputted from the light emitting layer, the transparent insulating layer having a through-hole penetrating therethrough in the thickness direction, the transparent insulating layer being laminated on the transparent conductive layer; a first electrode connected to the first semiconductor layer, the first electrode serving as one terminal to energize the light emitting layer; and a second electrode laminated on the transparent insulating layer, the second electrode being connected to the transparent conductive layer via the through-hole provided for the transparent insulating layer, the second electrode serving as the other terminal to energize the light emitting layer, wherein a contact surface of the transparent insulating layer with the transparent conductive layer and an inner wall surface of the through-hole provided for the transparent insulating layer form an acute angle.

A surface of the transparent insulating layer opposite to the contact surface and the inner wall surface of the through-hole provided for the transparent insulating layer may form an obtuse angle.

The through-hole formed in the transparent insulating layer may have a shape whose width increases from a side close to the transparent conductive layer toward a side far therefrom.

The through-hole formed in the transparent insulating layer may be substantially circular, and have a shape whose diameter increases from a side close to the transparent conductive layer toward a side far therefrom.

The contact surface of the transparent insulating layer and the inner wall surface of the through-hole provided for the transparent insulating layer may form an angle from 15 degrees to 60 degrees.

The transparent insulating layer may have the plural through-holes formed therein.

The second electrode may include: a first coating layer having conductivity and provided to cover the transparent insulating layer and the transparent conductive layer that is exposed via the through-hole; a metal reflection layer composed of a metal material that is conductive and reflective to light outputted from the light emitting layer, the metal reflection layer being provided on the first coating layer so as to be in contact with the first coating layer; a second coating layer provided to cover the metal reflection layer; and a connecting layer provided on the second coating layer so as to be in contact with the second coating layer, the connecting layer being used for electrical connection with outside.

The transparent conductive layer may be composed of a material that exhibits a first refractive index at a wavelength of light the light emitting layer outputs, and the transparent insulating layer may be composed of a material that exhibits a second refractive index at a wavelength of light the light emitting layer outputs, the second refractive index being smaller than the first refractive index.

The III-V semiconductor may be made of a group III nitride semiconductor.

The first electrode and the second electrode may be respectively mounted with solder bumps that are used for electrical connection with outside.

According to another aspect of the present invention, there is provided a semiconductor light emitting element including: a first semiconductor layer composed of a III-V semiconductor having a first conductivity type; a light emitting layer provided on the first semiconductor layer so as to be in contact with the first semiconductor layer, the light emitting layer being composed of a III-V semiconductor and emitting light by being energized; a second semiconductor layer provided on the light emitting layer so as to be in contact with the light emitting layer, the second semiconductor layer being composed of a III-V semiconductor having a second conductivity type opposite to the first conductivity type; a transparent conductive layer composed of a material that is conductive and transparent to light outputted from the light emitting layer, the transparent conductive layer being laminated on the second semiconductor layer; a transparent insulating layer composed of a material that is insulative and transparent to light outputted from the light emitting layer, the transparent insulating layer being laminated on the transparent conductive layer, the transparent insulating layer having plural through-holes that penetrate therethrough in the thickness direction and have diameters decreasing toward the transparent conductive layer; a first electrode connected to the first semiconductor layer, the first electrode serving as one terminal to energize the light emitting layer; and a second electrode including a conductor portion having plural connecting conductors that respectively have one ends connected to the transparent conductive layer via the plural through-holes and are respectively provided along inner wall surfaces in the plural through-holes, and an electrode portion provided on the transparent insulating layer so as to be in contact with the transparent insulating layer, the electrode portion being electrically connected with the other ends of the plural connecting conductors composing the conductor portion, the second electrode serving as the other terminal to energize the light emitting layer.

The second electrode may include: a first coating layer having conductivity and provided to cover the transparent insulating layer and the transparent conductive layer that is exposed via the through-holes; a metal reflection layer composed of a metal material that is conductive and reflective to light outputted from the light emitting layer, the metal reflection layer being provided on the first coating layer so as to be in contact with the first coating layer; a second coating layer provided to cover the metal reflection layer; and a connecting layer provided on the second coating layer so as to be in contact with the second coating layer, the connecting layer being used for electrical connection with outside.

The transparent conductive layer may be composed of an oxide containing indium (In), the metal reflection layer may be composed of a metal containing silver (Ag), and the connecting layer may be composed of a metal containing gold (Au).

The transparent conductive layer may be composed of a material that exhibits a first refractive index at a wavelength of light the light emitting layer outputs, and the transparent insulating layer may be composed of a material that exhibits a second refractive index at a wavelength of light the light emitting layer outputs, the second refractive index being smaller than the first refractive index.

The III-V semiconductor may be made of a group III nitride semiconductor.

The first electrode and the second electrode may be respectively mounted with solder bumps that are used for electrical connection with outside.

According to the present invention, it is possible to improve light extraction efficiency from a semiconductor light emitting element and to suppress the occurrence of cracks at an electrode provided for the semiconductor light emitting element.

BRIEF DESCRIPTION OF THE DRAWINGS

Exemplary embodiment (s) of the present invention will be described in detail based on the following figures, wherein.

DETAILED DESCRIPTION

An exemplary embodiment of the present invention will be described below in detail with reference to the accompanying drawings.

Figure 1:
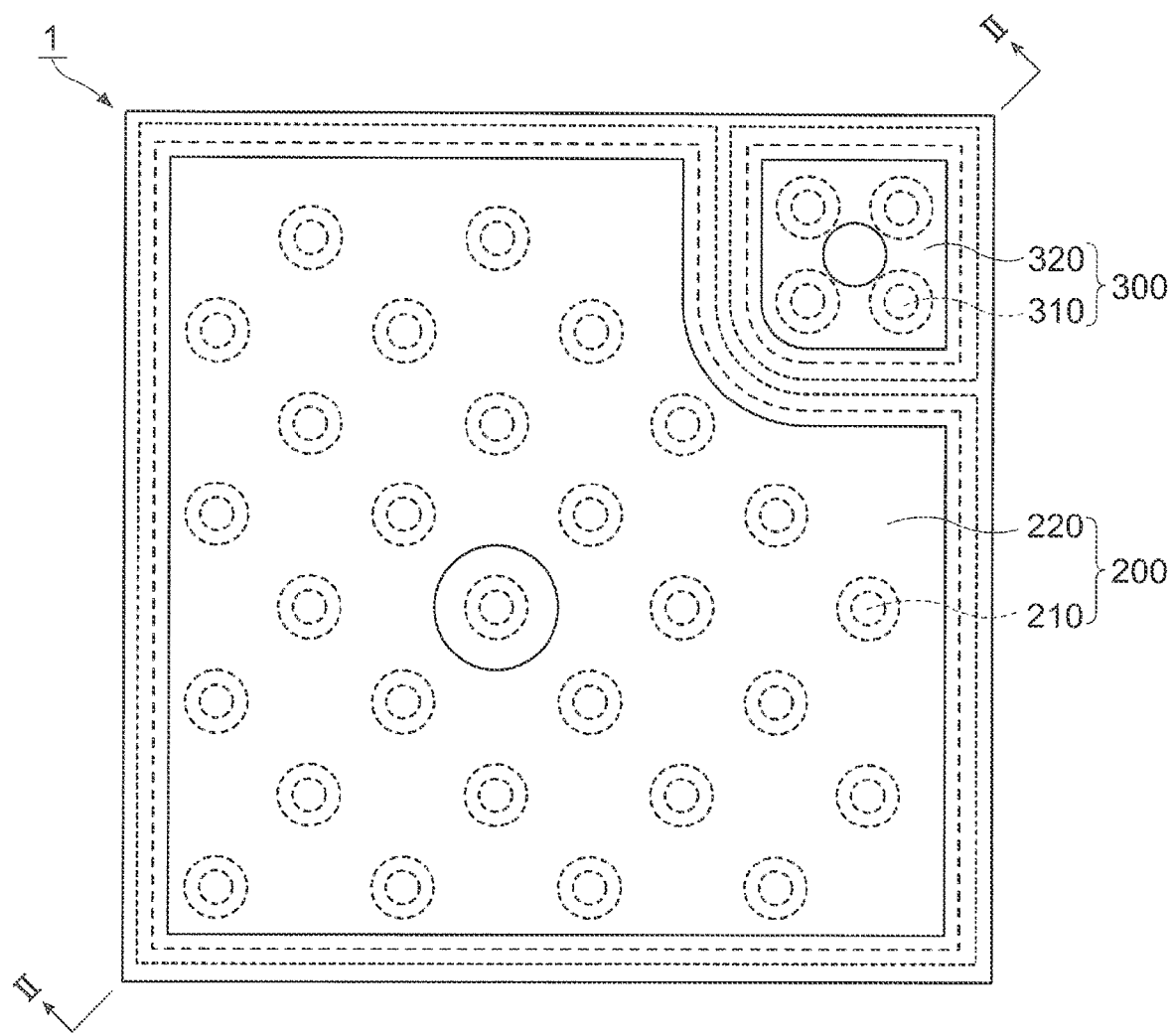
FIG. 1 is a top view of an example of a semiconductor light emitting element (light emitting diode) to which the present exemplary embodiment is applied.
Figure 2:
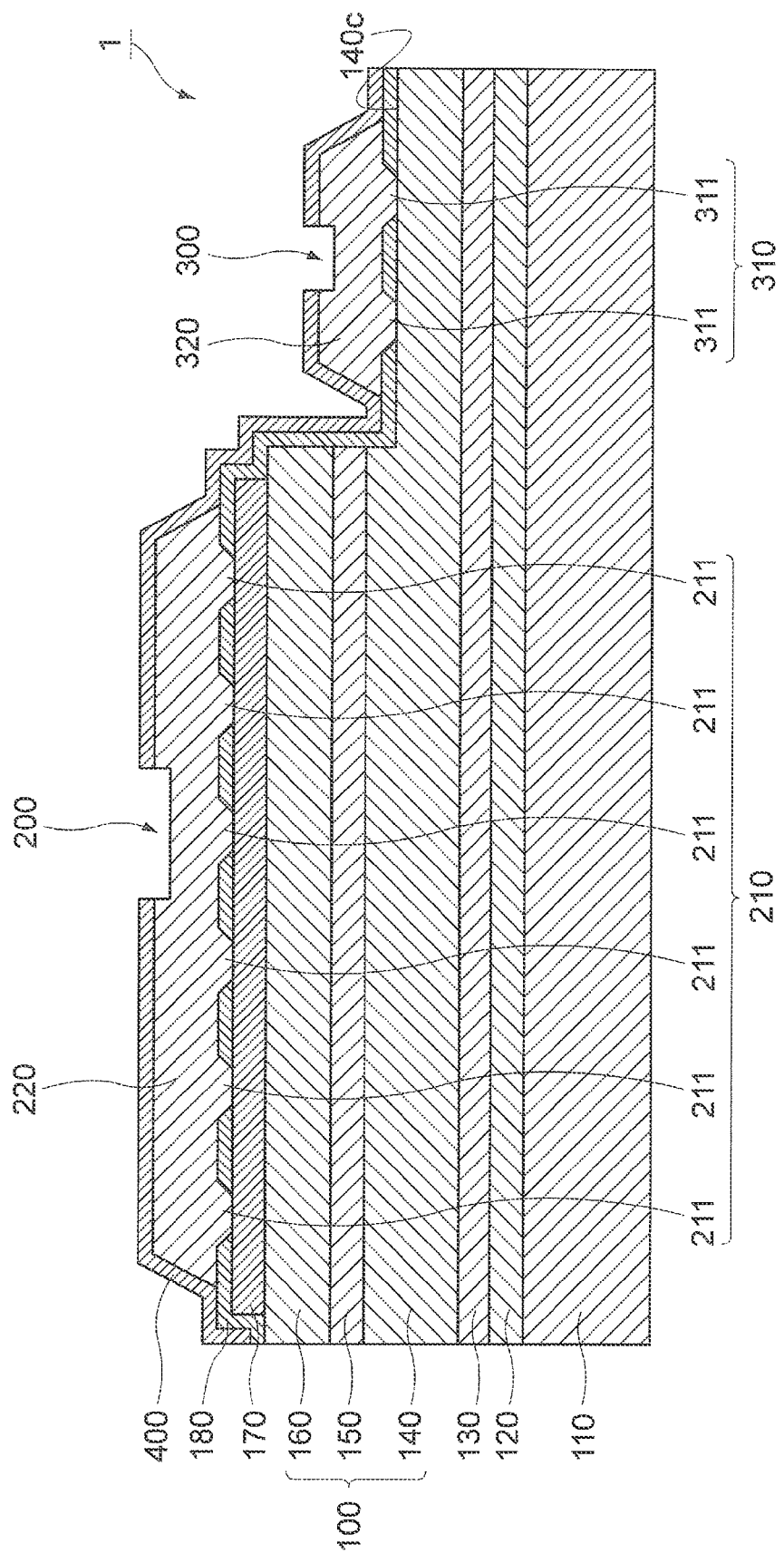
FIG. 2 is a cross-sectional view of the semiconductor light emitting element shown in FIG. 1, taken along the line II-II.

FIG. 1 shows a top view of an example of a semiconductor light emitting element (light emitting diode) 1 to which the present exemplary embodiment is applied. FIG. 2 is a cross-sectional view of the semiconductor light emitting element 1 shown in FIG. 1, taken along the line II-II. FIG. 1 illustrates a semiconductor light emitting element 1 from which a protective layer 400 to be described later is eliminated.

The semiconductor light emitting element 1 includes: a substrate 110; an intermediate layer 120 laminated on the substrate 110; and a base layer 130 laminated on the intermediate layer 120. The semiconductor light emitting element 1 also includes: an n-type semiconductor layer 140 laminated on the base layer 130; a light emitting layer 150 laminated on the n-type semiconductor layer 140; and a p-type semiconductor layer 160 laminated on the light emitting layer 150. Note that, in the following description, the n-type semiconductor layer 140, the light emitting layer 150 and the p-type semiconductor layer 160 are collectively referred to as laminated semiconductor layers 100, if necessary.

The semiconductor light emitting element 1 has the laminated p-type semiconductor layer 160, light emitting layer 150 and n-type semiconductor layer 140 cut out in the thickness direction at a part of their regions so that a top surface 140c of the n-type semiconductor layer 140 is exposed upward.

Additionally, the semiconductor light emitting element 1 includes a transparent conductive layer 170 that is conductive and transparent to light outputted from the light emitting layer 150 and that is laminated on the p-type semiconductor layer 160.

Furthermore, the semiconductor light emitting element 1 includes a transparent insulating layer 180 that is insulative and transparent to the light outputted from the light emitting layer 150 and that is laminated as a one-piece layer so as to run from the top surface of the transparent conductive layer 170 through the side surfaces of the p-type semiconductor layer 160, the light emitting layer 150 and the n-type semiconductor layer 140 to the top surface 140c of the n-type semiconductor layer 140. The transparent insulating layer 180 also functions as a protective film. Thus, a material that is chemically stable and excellent in moisture resistance is suitable for the transparent insulating layer 180.

Let first refractive index n1 and second refractive index n2 denote the refractive index of the transparent conductive layer 170 and that of the transparent insulating layer 180 for a light emission wavelength λ (nm) of the light emitting layer 150, respectively. Then, both the refractive indices have a relationship of n1>n2. The remainder (n1−n2) of both the refractive indices causes reflection on the interface between the transparent conductive layer 170 and the transparent insulating layer 180 to increase, and light extraction efficiency from the semiconductor light emitting element 1 to improve. It is desirable that the remainder of the refractive indices be 0.4 or more.

Additionally, plural through-holes penetrating the transparent insulating layer 180 in the thickness direction thereof are provided for the transparent insulating layer 180. In the present exemplary embodiment, among the plural through-holes, plural ones (twenty-eight in the specific example shown in FIG. 1) are arranged above the transparent conductive layer 170, for example, while plural ones (four in the specific example shown in FIG. 1) are arranged above the top surface 140c of the n-type semiconductor layer 140 as well, for example. With this configuration, the transparent conductive layer 170 is partially exposed via the plural through-holes when the transparent insulating layer 180 is laminated on the transparent conductive layer 170, for example; and the n-type semiconductor layer 140 is partially exposed via the plural through-holes when the transparent insulating layer 180 is laminated on the top surface 140c of the n-type semiconductor layer 140, for example. Each of the plural through-holes provided for the transparent insulating layer 180 has a circular shape as seen from above (see FIG. 1), and further has a so-called tapered cross section (see FIG. 2) such that the diameter of the through-hole decreases toward the transparent conductive layer 170. A circle, which has no stress concentration, is the most suitable for the shape of the through-holes formed in the transparent insulating layer 180. However, a polygon having a large radius of curvature at the angles thereof, an ellipse or the like may be employed. Meanwhile, in the specific example shown in FIG. 2, the through-holes reach the boundary between the transparent insulating layer 180 and the transparent conductive layer 170. However, the through-holes may extend partially into the transparent conductive layer 170 unless the through-holes penetrate the transparent conductive layer 170.

Furthermore, the semiconductor light emitting element 1 includes a p-electrode 200 that functions as one electrode (positive electrode) when the light emitting layer 150 is caused to emit light and that is further laminated on the transparent conductive layer 170 and the transparent insulating layer 180, which are laminated on the p-type semiconductor layer 160. The p-electrode 200 has: a p-conductor portion 210 (corresponding to a conductor portion) formed of plural (twenty-eight in the specific example shown in FIG. 1) p-connecting conductors 211 (corresponding to plural connecting conductors) that penetrate the respective plural through-holes provided for the transparent insulating layer 180 and that have one ends provided so as to be in contact with the transparent conductive layer 170; and a p-pad portion 220 (corresponding to an electrode portion) that is formed on the transparent insulating layer 180, connected with the other ends of the plural p-connecting conductors 211 and is used for electrical connection with outside. Electrically, these plural through-holes cause a current to pass through the light emitting layer 150 with a uniform current density, and thereby improve light emission efficiency of the whole light emitting layer 150 and yields of the light emitting element. It is desirable that the transparent insulating layer 180 be arranged with a large number of tiny through-holes. However, the size of the through-holes is preferably in the range of 1 to 20 μm because of unevenness in forming the through-holes and difficulty in micromachining technique. Note that, in the present exemplary embodiment, the p-conductor portion 210 and the p-pad portion 220 have an integral structure in the p-electrode 200. This will be described later.

Moreover, the semiconductor light emitting element 1 further includes an n-electrode 300 that functions as the other electrode (negative electrode) when the light emitting layer 150 is caused to emit light and that is further laminated on the transparent insulating layer 180, which is laminated on the top surface 140c of the n-type semiconductor layer 140. The n-electrode 300 has: an n-conductor portion 310 formed of plural (four in the specific example shown in FIG. 1) n-connecting conductors 311 that penetrate the respective plural through-holes provided for the transparent insulating layer 180 and that have one ends provided so as to be in contact with the top surface 140c of the n-type semiconductor layer 140; and an n-pad portion 320 that is connected with the other ends of the plural n-connecting conductors 311 and is used for electrical connection with outside. Note that, in the present exemplary embodiment, the n-conductor portion 310 and the n-pad portion 320 have an integral structure in the n-electrode 300 similarly to the above-described p-electrode 200. This will be described later.

Additionally, the semiconductor light emitting element 1 includes the protective layer 400 that is laminated as a one-piece layer over the p-electrode 200, the periphery of the p-electrode 200, the side surfaces of the p-type semiconductor layer 160, the light emitting layer 150 and the n-type semiconductor layer 140, the n-electrode 300 and the periphery of the n-electrode 300, to thereby protect the p-electrode 200 and the n-electrode 300. However, the protective layer 400 is not provided at a roughly central region (the circular region in this specific example) of the top surface of the p-electrode 200 and a roughly central region (the circular region in this specific example) of the top surface of the n-electrode 300. With this configuration, in the semiconductor light emitting element 1, the top surface of the p-electrode 200 and that of the n-electrode 300 are partially exposed to the outside. These exposed regions are used for electrical connection with outside, when the semiconductor light emitting element 1 is mounted.

Figure 7:
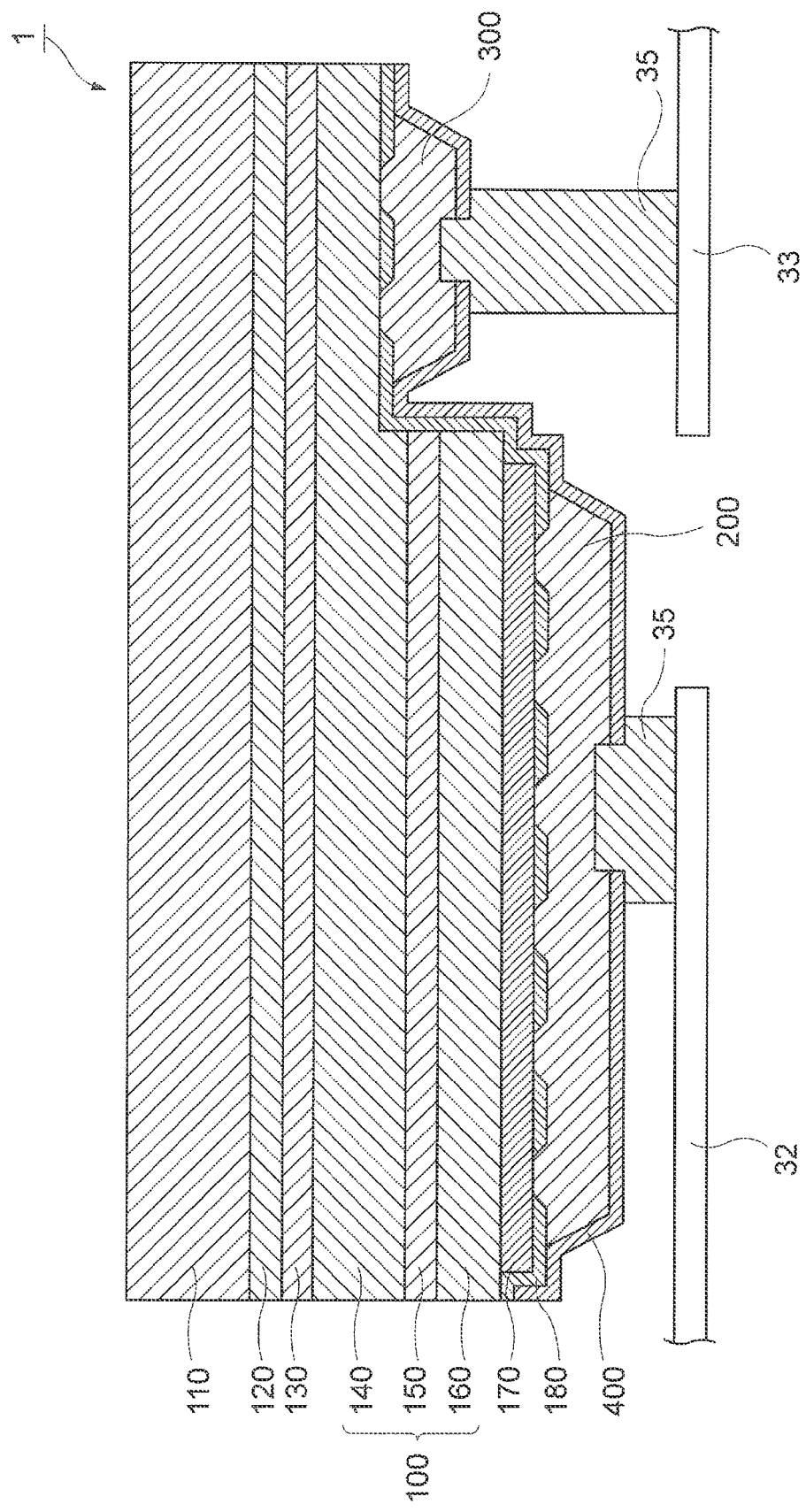
FIG. 7 is a diagram showing an example how the semiconductor light emitting element is mounted on the light emitting device.

When the semiconductor light emitting element 1 is used by flip-chip bonding as shown in FIG. 7 to be described later, solder bumps may be respectively formed in advance at the exposed region of the p-electrode 200 and that of the n-electrode 300 shown in FIG. 2. A eutectic metal such as AuSn, for example, having a low melting point (less than 400 degrees C.) is a suitable material for the solder bumps. It is desirable that a solder bump used for such a purpose be a film having a thickness of 1 μm or more and be formed by a plating method, for example, from the viewpoint of productivity.

As described above, the semiconductor light emitting element 1 of the present exemplary embodiment has a structure in which the p-electrode 200 and the n-electrode 300 are formed on one surface side that is opposite to the substrate 110. In the semiconductor light emitting element 1, the p-electrode 200 and the n-electrode 300 are used as the positive electrode and the negative electrode, respectively, and the light emitting layer 150 emits light by feeding a current through the laminated semiconductor layers 100 (more specifically, the p-type semiconductor layer 160, the light emitting layer 150 and the n-type semiconductor layer 140) via both the electrodes.

Hereinafter, a description is given of each component of the semiconductor light emitting element 1 of the present exemplary embodiment.

<Substrate>

The substrate 110 is not particularly limited as long as it is a substrate having a surface on which group III nitride semiconductor crystals are epitaxially grown. The substrate 110 to be used may be selected from various substrates.

The semiconductor light emitting element 1 of the present exemplary embodiment is mounted by flip-chip bonding so that light is extracted from the substrate 110 side, as will be described later. Accordingly, it is preferable that the semiconductor light emitting element 1 have light transparency to the light emitted from the light emitting layer 150 in order to enhance the light extraction efficiency. In particular, it is preferable to use, as the substrate 110, sapphire whose C-plane is the principal plane. If sapphire is used as the substrate 110, it is better to form the intermediate layer 120 (a buffer layer) on the C-plane of the sapphire.

<Intermediate Layer>

The intermediate layer 120 is preferably made of polycrystalline $Al_xGa_{1-x}N$ (0≤x≤1), and is more preferably made of single-crystal $Al_xGa_{1-x}N$ (0≤x≤1). For example, the intermediate layer 120 may be made of polycrystalline $Al_xGa_{1-x}N$ (0≤x≤1) having a thickness of 10 to 500 nm. The intermediate layer 120 has a function of reducing the difference in lattice constants between the substrate 110 and the base layer 130, and facilitating formation of a single-crystal layer oriented in the c-axis on the (0001) plane (C-plane) of the substrate 110. Accordingly, if a single-crystal base layer 130 is laminated on the intermediate layer 120, a base layer 130 having more favorable crystallinity can be laminated.

<Base Layer>

As the base layer 130, $Al_xGa_yIn_zN$ (0≤x≤1, 0≤y≤1, 0≤z≤1, x+y+z=1) may be used. Using $Al_xGa_{1-x}N$ (0≤x≤1) makes it easier to form a base layer 130 having favorable crystallinity.

The film thickness of the base layer 130 is preferably 0.1 μm or more. Setting the film thickness at more than this value tends to give an $Al_xGa_{1-x}N$ layer having favorable crystallinity. Additionally, the film thickness of the base layer 130 is preferably 10 μm or less.

<Laminated Semiconductor Layers>

The laminated semiconductor layers 100 including a group III nitride semiconductor are formed by laminating the n-type semiconductor layer 140, the light emitting layer 150 and the p-type semiconductor layer 160 on the substrate 110 in this order, as shown in FIG. 2. Each of the n-type semiconductor layer 140, the light emitting layer 150 and the p-type semiconductor layer 160 may be formed of plural semiconductor layers.

The n-type semiconductor layer 140 conducts electricity by using electrons as carriers, while the p-type semiconductor layer 160 conducts electricity by using positive holes as carriers. In this specific example, the n-type where electrons are used as carriers corresponds to a first conductivity type, while the p-type where positive holes are used as carriers corresponds to a second conductivity type.

<N-Type Semiconductor Layer>

The n-type semiconductor layer 140, which is an example of a first semiconductor layer having a first conductivity type, is preferably formed of: an n-contact layer laminated on the substrate 110 side (on the base layer 130 in this specific example); and an n-clad layer laminated on the n-contact layer. Note that the n-contact layer may also serve as the n-clad layer. Additionally, the above-mentioned base layer 130 may be included in the n-type semiconductor layer 140.

The n-contact layer is a layer for providing the n-electrode 300. Thus, it is better to expose the n-contact layer at the top surface 140c of the n-type semiconductor layer 140. It is better to use an $Al_xGa_{1-x}N$ layer (0≤x≤1, preferably 0≤x≤0.5, and more preferably 0≤x≤0.1) as the n-contact layer.

The n-clad layer is a layer to implement carrier injection and carrier confinement into the light emitting layer 150. Note that, in the present specification, AlGaN, GaN and GaInN may be written with the composition ratios of the respective chemical elements being omitted. The n-clad layer may be formed of AlGaN, GaN, GaInN or the like. Additionally, a heterojunction of these structures or a superlattice structure obtained by laminating these structures several times may be employed. If the n-clad layer is formed of GaInN, it is desirable that the band gap thereof be set larger than that of GaInN of the light emitting layer 150.

If a layer including a superlattice structure is employed as the n-clad layer, the n-clad layer may include a structure in which an n-side first layer and an n-side second layer are laminated. Here, the n-side first layer is made of a group III nitride semiconductor having a film thickness of 10 nm or less. The n-side second layer is made of a group III nitride semiconductor having a composition different from that of the n-side first layer and having a film thickness of 10 nm or less.

Additionally, the n-clad layer may include a structure in which the n-side first layers and the n-side second layers are alternately and repeatedly laminated. In this case, it is preferable that the structure be an alternating structure of GaInN and GaN, or an alternating structure of plural types of GaInN having compositions different from each other.

<Light Emitting Layer>

The light emitting layer 150 may employ a single quantum well structure, a multiple quantum well structure, or the like.

As a well layer having a quantum well structure, a group III nitride semiconductor layer made of $Ga_{1-y}In_yN$ (0<y<0.4) is typically used. The film thickness of the well layer may be set at a film thickness enough to obtain quantum effect, for example, at 1 to 10 nm. It is preferable to set the film thickness at 2 to 6 nm from the viewpoint of light emission output.

If the light emitting layer 150 has a multiple quantum well structure, the above-mentioned $Ga_{1-y}In_yN$ is used as the well layer, while $Al_zGa_{1-z}N$ (0≤z≤0.3) having band gap energy larger than that of the well layer is used as a barrier layer. The well layer and the barrier layer may be doped with dopant, but need not be doped.

<P-Type Semiconductor Layer>

The p-type semiconductor layer 160, which is an example of a second semiconductor layer having a second conductivity type, is preferably formed of: a p-clad layer laminated on the light emitting layer 150; and a p-contact layer laminated on the p-clad layer. Note that the p-contact layer may also serve as the p-clad layer.

The p-clad layer is a layer to implement carrier confinement and carrier injection into the light emitting layer 150. The p-clad layer is not limited to a particular one as long as it has a composition having band gap energy larger than that of the light emitting layer 150 and allows for carrier confinement into the light emitting layer 150. For example, $Al_xGa_{1-x}N$ ($0 \leq x \leq 0.4$) may be used as the p-clad layer.

A p-clad layer formed of such AlGaN is preferable from the viewpoint of carrier confinement into the light emitting layer 150. The film thickness of the p-clad layer is not particularly limited, but is preferably 1 to 400 nm, and more preferably 5 to 100 nm.

Additionally, the p-clad layer may have a superlattice structure obtained by being laminated several times. In this case, it is preferable to have an alternating structure of AlGaN and AlGaN, or an alternating structure of AlGaN and GaN.

The p-contact layer is a layer for providing the p-electrode 200 with the transparent conductive layer 170 interposed therebetween. It is preferable that the p-contact layer be $Al_xGa_{1-x}N$ ($0 \leq x \leq 0.4$). A p-contact layer having an Al composition in the above range is preferable in that favorable crystallinity and a favorable ohmic contact with the transparent conductive layer 170 can be maintained.

The film thickness of the p-contact layer is not particularly limited, but is preferably 10 to 500 nm, and more preferably 50 to 200 nm. Setting the film thickness of the p-contact layer in these ranges is preferable in that a forward voltage Vf can be reduced.

<Transparent Conductive Layer>

The transparent conductive layer 170 is formed so as to cover almost the entire top surface of the p-type semiconductor layer 160 except for the periphery thereof.

As the transparent conductive layer 170, it is preferable to use those which can make an ohmic contact with the p-type semiconductor layer 160 and has a low contact resistance between the p-type semiconductor layer 160 and the transparent conductive layer 170. Additionally, in the semiconductor light emitting element 1, since the light from the light emitting layer 150 is extracted to the substrate 110 side through the transparent conductive layer 170, the transparent insulating layer 180 and the like, it is preferable to use what has excellent light transparency as the transparent conductive layer 170. Furthermore, in order to diffuse a current uniformly over the whole surface of the p-type semiconductor layer 160, it is preferable to use, as the transparent conductive layer 170, what has excellent conductivity and a narrow resistance distribution.

The thickness of the transparent conductive layer 170 can be selected from the range of 2 nm to 500 nm. If the thickness of the transparent conductive layer 170 is less than 2 nm, there are some cases in which an ohmic contact with the p-type semiconductor layer 160 is hardly made. Meanwhile, if the thickness of the transparent conductive layer 170 is more than 500 nm, there are some cases that are not preferable from the viewpoint of light transparency to light outputted from the light emitting layer 150 and light reflected from the transparent insulating layer 180 or the like.

For example, an oxide conductive material having favorable light transparency to light of a wavelength emitted from the light emitting layer 150 can be used as the transparent conductive layer 170. The transmittance to light of a wavelength outputted from the light emitting layer 150 is 90% or more, desirably 95% or more. In particular, some of oxides containing In are preferable in that they have excellent in both light transparency and conductivity as compared with other transparent conductive films. Listed as examples of conductive oxides containing In are IZO (indium zinc oxide ($In_2O_3$—ZnO)), ITO (indium tin oxide ($In_2O_3$—$SnO_2$)), IGO (indium gallium oxide ($In_2O_3$—$Ga_2O_3$)), ICO (indium cerium oxide ($In_2O_3$—$CeO_2$)), and the like. Note that these may be doped with dopant such as fluorine, for example. Further, an oxide not containing In, for example, a conductivity material such as carrier-doped $SnO_2$, $ZnO_2$ and $TiO_2$ may be used.

The transparent conductive layer 170 can be formed by providing these materials by use of a conventional methods well known in the art. Then, after the transparent conductive layer 170 is formed, heat treatment is performed to facilitate crystallization. This increases the light transmittance of the transparent conductive layer 170 and decreases the sheet resistance thereof, which makes it easy to have an ohmic contact.

In the present exemplary embodiment, one having a crystallized structure may be used for the transparent conductive layer 170. In particular, a translucent material (for example, IZO, ITO or the like) including an $In_2O_3$ crystal having a hexagonal structure or a bixbite structure may be preferably used.

Additionally, it is preferable to employ a film having a composition with a low resistivity as a film used for the transparent conductive layer 170. For example, the ZnO concentration in IZO is preferably in the range of 1 to 20 wt %, and is more preferably in the range of 5 to 15 wt %. A concentration of 10 wt % is particularly preferable.

Furthermore, it is desirable to form the transparent conductive layer 170 by a sputtering method, for example, from the viewpoint of enhancing adhesion of the obtained film.

<Transparent Insulating Layer>

As shown in FIG. 2, for example, the transparent insulating layer 180 is laminated so as to cover the transparent conductive layer 170, that region of the p-type semiconductor layer 160 on which the transparent conductive layer 170 is not laminated and that region of the n-type semiconductor layer 140 on which the light emitting layer 150 is not laminated. Additionally, the transparent insulating layer 180 covers not only the surfaces of the respective layers but also the side surfaces of the light emitting layer 150 and the p-type semiconductor layer 160, namely, the wall portion of a step formed by the p-type semiconductor layer 160 and the n-type semiconductor layer 140. The transparent insulating layer 180 further covers the side surfaces of the transparent conductive layer 170 as well.

As described above, the transparent insulating layer 180 is composed of a material that has transparency to the light outputted from the light emitting layer 150, a refractive index (the second refractive index n2) lower than the refractive index of the transparent conductive layer 170 (the first refractive index n1), and insulation. As a material composing the transparent insulating layer 180, $SiO_2$ (silicon dioxide), $MgF_2$ (magnesium fluoride), $CaF_2$ (calcium fluoride), $Si_3N_4$ (silicon nitride) or $Al_2O_3$ (aluminum oxide) may be used, for example. In this specific example, $SiO_2$ (silicon dioxide), which is an optimal material having high insulation, a small refractive index (1.4 to 1.5) and excellent moisture resistance is used as the transparent insulating layer 180.

In the present exemplary embodiment, let H denote the film thickness of the transparent insulating layer 180, and let Q denote the quotient obtained by dividing the light emission wavelength λ (nm) of the light emitting layer 150 by four times the second refractive index n2, which is the refractive index of the transparent insulating layer 180. Then, the film thickness H is defined by the following relational expression (1) where A is an integer.

$$H=AQ \quad (1)$$

It is preferable that the film thickness H of the transparent insulating layer 180 be defined on the basis of the following expression (2), in other words, the film thickness H be within a range of 3λ/4n2 or more (the film thickness H is 3Q or more). Furthermore, it is desirable that the film thickness H be 5Q or more in order to improve light emission output. However, it is preferable that the film thickness H be 20Q or less, desirably 10Q or less, because the cost of production is limited and cracks become more likely to occur, which is a problem of the present invention, as the film thickness increases. If the film thickness H of the transparent insulating layer 180 is selected from this range, the optical reflectance to the light outputted from the light emitting layer 150 increases, and as a result, high light emission output is obtained. In this specific example, the film thickness H of the transparent insulating layer 180 is 375 nm, if A=5, λ=460 nm and n2=1.5, for example. Details of the plural through-holes provided for the transparent insulating layer 180, such as shape and size, will be described later.

$$3\lambda/4n2 \ge H \quad (2)$$

<P-Electrode>

Figure 3:
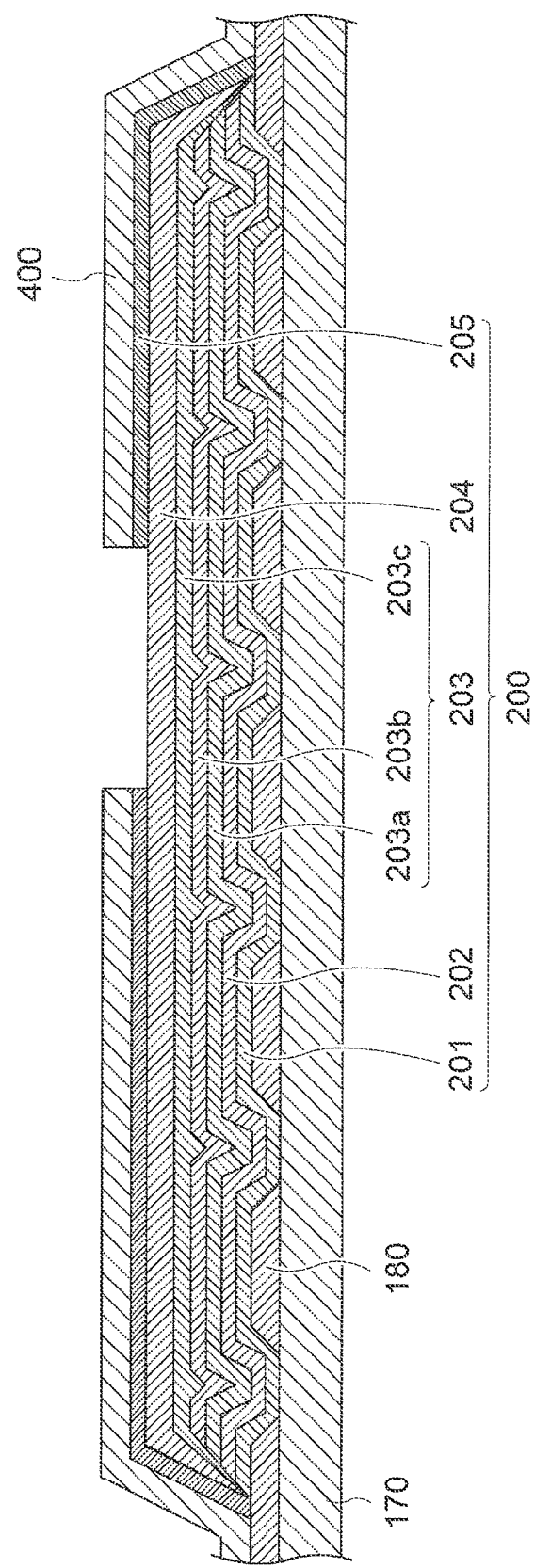
FIG. 3 is a diagram showing an exemplary cross-sectional structure around the p-electrode in the semiconductor light emitting element.

FIG. 3 is a diagram showing an exemplary cross-sectional structure around the p-electrode 200 in the semiconductor light emitting element 1 of the present exemplary embodiment. FIG. 3 shows enlargement of the cross section around the p-electrode 200 in FIG. 2.

The p-electrode 200, which is an example of a second electrode, includes: a p-adhesion layer 201 laminated so as to be in contact with the transparent conductive layer 170 and the transparent insulating layer 180 on the side closest to the transparent conductive layer 170 and the transparent insulating layer 180; a p-metal reflection layer 202 laminated on the p-adhesion layer 201; a p-diffusion barrier layer 203 laminated on the p-metal reflection layer 202; a p-bonding layer 204 laminated on the p-diffusion barrier layer 203; and a p-protective adhesion layer 205 laminated on the p-bonding layer 204. On the p-protective adhesion layer 205, the protective layer 400 is further laminated. In the present exemplary embodiment, the p-adhesion layer 201, the p-metal reflection layer 202, the p-diffusion barrier layer 203, the p-bonding layer 204 and the p-protective adhesion layer 205 configure the p-electrode 200 in which the p-pad portion 220 and the p-conductor portion 210 including the plural p-connecting conductors 211 are integrated.

Hereinafter, a description is given of each component of the p-electrode 200 of the present exemplary embodiment.

[P-Adhesion Layer]

As shown in FIG. 3, the p-adhesion layer 201, which is an example of a first coating layer, is laminated on the transparent insulating layer 180 and the transparent conductive layer 170 that is exposed via the through-holes provided for the transparent insulating layer 180. On the p-adhesion layer 201, the p-metal reflection layer 202 is further laminated. The p-adhesion layer 201 is provided for the purpose of enhancing physical adhesion of the materials composing these three layers. However, if adhesion between the transparent insulating layer 180 and the p-metal reflection layer 202 is favorable, the p-adhesion layer 201 may be omitted.

In the semiconductor light emitting element 1 of the present exemplary embodiment, that portion of the light emitted from the light emitting layer 150 which enters the p-electrode 200 is reflected toward the substrate 110 through the transparent conductive layer 170, the transparent insulating layer 180, the p-metal reflection layer 202 and the like. Thus, it is preferable to use a material having excellent light transparency as the p-adhesion layer 201. Furthermore, in order to diffuse a current uniformly over the whole surface of the p-type semiconductor layer 160 from the p-electrode 200, it is preferable to use, as the p-adhesion layer 201, a material having excellent conductivity, a narrow resistance distribution in the surface direction and a suppressed contact resistance between the transparent conductive layer 170 and the p-adhesion layer 201.

In these respects, a transparent conductive layer is preferably used as the p-adhesion layer 201. In this specific example, a metal oxide having conductivity and favorable light transparency to light with wavelengths outputted from the light emitting layer 150 is used as the p-adhesion layer 201. In particular, a metal oxide containing In is preferable in that it has excellent in both light transparency and conductivity as compared with other transparent conductive films. Listed as examples of conductive metal oxides containing In are ITO (indium tin oxide ($In_2O_3$—$SnO_2$)), IZO (indium zinc oxide ($In_2O_3$—$ZnO$)), IGO (indium gallium oxide ($In_2O_3$—$Ga_2O_3$)), ICO (indium cerium oxide ($In_2O_3$—$CeO_2$)), and the like. IZO (indium zinc oxide ($In_2O_3$—$ZnO$)) is particularly preferable.

The film thickness of the p-adhesion layer 201 is preferably selected from the range of 1 nm to 50 nm because of the above-described reasons. If the film thickness of the p-adhesion layer 201 is less than 1 nm, adhesion to the transparent conductive layer 170 may be reduced to increase the contact resistance. On the other hand, if the film thickness of the p-adhesion layer 201 exceeds 50 nm, light transparency reduces, causing light emission output of the obtained semiconductor light emitting element 1 to reduce. In this specific example, it is desirable that the film thickness of the p-adhesion layer 201 be 1 to 5 nm, for example.

[P-Metal Reflection Layer]

As shown in FIG. 3, the p-metal reflection layer 202, which is an example of a metal reflection layer, is laminated on the p-adhesion layer 201. On the p-metal reflection layer 202, the p-diffusion barrier layer 203 is further laminated. The p-metal reflection layer 202 is provided for the purpose of reflecting, toward the substrate 110, light that is emitted from the light emitting layer 150 and that has passed through the transparent conductive layer 170 and the transparent insulating layer 180. In the present exemplary embodiment, the transparent insulating layer 180 and the p-metal reflection layer 202 are arranged with the p-adhesion layer 201 interposed therebetween, resulting in a structure in which the transparent insulating layer 180 and the p-metal reflection layer 202 do not directly come into contact with each other. Since the p-metal reflection layer 202 is one of the components of the p-electrode 200, it is preferable to use, as the p-metal reflection layer 202, one having a low self-resistance and a suppressed contact resistance between the p-adhesion layer 201 and the p-metal reflection layer 202.

The p-metal reflection layer 202 of the present exemplary embodiment is composed of a metal, such as silver, palladium, copper, aluminum, nickel, gold and platinum, and an alloy containing at least one of these. In particular, it is preferable to use silver or a silver alloy as the p-metal reflection layer 202 from the viewpoint of having a high reflectance to light of all wavelengths in the visible light region that is outputted from the light emitting layer 150. If silver is used as the p-metal reflection layer 202, the heat resistance and the resistance to high temperature and humidity (suppression of so-called migration) may not be sufficient depending on environment of usage. Thus, a silver alloy is preferably used. In particular, it is desirable to use a silver alloy containing palladium and copper.

If silver or a silver alloy is used as the p-metal reflection layer 202, it is preferable to use an oxide containing In, for example, a transparent conductivity material such as IZO and ITO, as the p-adhesion layer 201. If the p-metal reflection layer 202 is directly laminated on the transparent insulating layer 180 without providing the p-adhesion layer 201, adhesion is considerably reduced as compared with a case in which the p-adhesion layer 201 is provided.

The film thickness of the p-metal reflection layer 202 is preferably selected from the range of 80 nm to 200 nm. If the film thickness of the p-metal reflection layer 202 is less than 80 nm, the light reflectance arising from the p-metal reflection layer 202 reduces. Meanwhile, if the film thickness of the p-metal reflection layer 202 exceeds 200 nm, the cost of manufacturing the semiconductor light emitting element 1 increases. In this specific example, the film thickness of the p-metal reflection layer 202 is 100 nm.

[P-Diffusion Barrier Layer]

As shown in FIG. 3, the p-diffusion barrier layer 203, which is an example of a second coating layer, is laminated on the p-metal reflection layer 202. On the p-diffusion barrier layer 203, the p-bonding layer 204 is further laminated. The p-diffusion barrier layer 203 is provided for the purpose of preventing diffusion of the metal (a silver alloy in this specific example) composing the p-metal reflection layer 202, which is in contact with the p-diffusion barrier layer 203, and the metal (gold in this specific example (details thereof will be described later)) composing the p-bonding layer 204, which is in contact with the p-diffusion barrier layer 203. In the present exemplary embodiment, the p-metal reflection layer 202 and the p-bonding layer 204 are arranged with the p-diffusion barrier layer 203 interposed therebetween, resulting in a structure in which the p-metal reflection layer 202 and the p-bonding layer 204 do not directly come into contact with each other. Since the p-diffusion barrier layer 203 is one of the components of the p-electrode 200, it is preferable to use, as the p-diffusion barrier layer 203, one having a low self-resistance and suppressed contact resistances between the p-diffusion barrier layer 203 and the p-metal reflection layer 202 and between the p-diffusion barrier layer 203 and the p-bonding layer 204. Note that the p-diffusion barrier layer 203 needs not have light transparency unlike the above-described p-adhesion layer 201, because the p-diffusion barrier layer 203 is not basically required to have a function of transmitting the light from the light emitting layer 150. It is desirable to use, for the p-diffusion barrier layer 203, a metal that is stable at a high temperature and has a high melting point, such as titanium, tantalum, tungsten, molybdenum, chromium, platinum, palladium and nickel. The p-diffusion barrier layer 203 may be configured with a single layer. However, if there is no suitable material that gives favorable adhesion to both the p-metal reflection layer 202 and the p-bonding layer 204 and that is not alloyed with these layers, it is desirable to use a multilayer structure as will be described below.

The p-diffusion barrier layer 203 of the present exemplary embodiment includes: a p-first diffusion barrier layer 203a laminated on the p-metal reflection layer 202; a p-second diffusion barrier layer 203b laminated on the p-first diffusion barrier layer 203a; and a p-third diffusion barrier layer 203c laminated on the p-second diffusion barrier layer 203b. On the p-third diffusion barrier layer 203c, the p-bonding layer 204 is further laminated.

In the present exemplary embodiment, tantalum, titanium and platinum are used as the p-first diffusion barrier layer 203a, the p-second diffusion barrier layer 203b and the p-third diffusion barrier layer 203c, respectively. Note that nickel may be used as the p-second diffusion barrier layer 203b instead of titanium.

The p-first diffusion barrier layer 203a and the p-second diffusion barrier layer 203b have a function of preventing not only diffusion of the metal (a silver alloy in this specific example) composing the above-described p-metal reflection layer 202 but also diffusion of the metal (platinum in this specific example) composing the p-third diffusion barrier layer 203c. Meanwhile, the p-third diffusion barrier layer 203c has a function of preventing not only diffusion of the metal (gold in this specific example) composing the above-described p-bonding layer 204 but also diffusion of the metal (titanium in this specific example) composing the p-second diffusion barrier layer 203b.

The film thickness of the p-first diffusion barrier layer 203a is preferably selected from the range of 20 nm to 200 nm. If the film thickness of the p-first diffusion barrier layer 203a is less than 20 nm, the barrier property between the p-metal reflection layer 202 (a silver alloy in this specific example) and the p-third diffusion barrier layer 203c (platinum in this specific example) becomes insufficient, which may lead to a reaction of silver and platinum in this specific example. Meanwhile, the film thickness of the p-first diffusion barrier layer 203a exceeds 200 nm, the cost of manufacturing the semiconductor light emitting element 1 increases. In this specific example, the film thickness of the p-first diffusion barrier layer 203a is 50 nm.

The film thickness of the p-second diffusion barrier layer 203b is preferably selected from the range of 20 nm to 500 nm. If the film thickness of the p-second diffusion barrier layer 203b is less than 20 nm, it is feared that adhesion between the p-second diffusion barrier layer 203b and the p-third diffusion barrier layer 203c reduces. Further, the barrier property between the p-metal reflection layer 202 (a silver alloy in this specific example) and the p-third diffusion barrier layer 203c (platinum in this specific example) becomes insufficient, which may lead to a reaction of silver and platinum in this specific example. Meanwhile, the film thickness of the p-second diffusion barrier layer 203b exceeds 500 nm, the cost of manufacturing the semiconductor light emitting element 1 increases. In this specific example, the film thickness of the p-second diffusion barrier layer 203b is 40 nm.

Furthermore, the film thickness of the p-third diffusion barrier layer 203c is preferably selected from the range of 50 nm to 200 nm. If the film thickness of the p-third diffusion barrier layer 203c is less than 50 nm, the p-second diffusion barrier layer 203b (titanium in this specific example) and the p-bonding layer 204 (gold in this specific example) may react with each other. Meanwhile, if the film thickness of the p-third diffusion barrier layer 203c exceeds 200 nm, the cost of manufacturing the semiconductor light emitting element 1 increases. In this specific example, the film thickness of the p-third diffusion barrier layer 203c is 100 nm.

[P-Bonding Layer]

As shown in FIG. 3, the p-bonding layer 204, which is an example of a connecting layer, is laminated on the p-diffusion barrier layer 203. On the p-bonding layer 204, the p-protective adhesion layer 205 is laminated except for a partial region that is finally exposed to the outside. The p-bonding layer 204 is provided for the purpose of feeding the p-electrode 200 by being electrically connected to the outside. In the present exemplary embodiment, the p-metal reflection layer 202 and the p-bonding layer 204 are arranged with the p-diffusion barrier layer 203 interposed therebetween, resulting in a structure in which the p-metal reflection layer 202 and the p-bonding layer 204 do not directly come into contact with each other. Since the p-bonding layer 204 is one of the components of the p-electrode 200, it is preferable to use, as the p-bonding layer 204, one having a low self-resistance and a suppressed contact resistance between the p-diffusion barrier layer 203 and the p-bonding layer 204. Note that, similarly to the p-diffusion barrier layer 203, the p-bonding layer 204 needs not have light transparency because the p-bonding layer 204 is not basically required to have a function of transmitting the light from the light emitting layer 150.

The p-bonding layer 204 of the present exemplary embodiment may have a multilayer structure of metals or a single-layer structure of gold as long as the uppermost layer, namely, the outermost layer exposed to the outside, is gold. In the present exemplary embodiment, a single-layer film of gold is employed as the p-bonding layer 204.

The film thickness of the p-bonding layer 204 is preferably selected from the range of 100 nm to 2 μm. If the film thickness of the p-bonding layer 204 is less than 100 nm, a property of absorbing an impact at the time of bonding reduces. Meanwhile, if the film thickness of the p-bonding layer 204 exceeds 2 μm, the cost of manufacturing the semiconductor light emitting element 1 increases. In this specific example, the film thickness of the p-bonding layer 204 is 550 nm.

[P-Protective Adhesion Layer]

As shown in FIG. 3, the p-protective adhesion layer 205 is laminated on the p-bonding layer 204 except for the partial region thereof that is finally exposed to the outside. On the p-protective adhesion layer 205, the protective layer 400 is further laminated. The p-protective adhesion layer 205 is provided for the purpose of enhancing physical adhesion of the materials composing these two layers.

The p-protective adhesion layer 205 of the present exemplary embodiment is composed of titanium. Note that tantalum may be used as the p-protective adhesion layer 205 instead of titanium.

The film thickness of the p-protective adhesion layer 205 is preferably selected from the range of 5 nm to 50 nm. If the film thickness of the p-protective adhesion layer 205 is less than 5 nm, adhesion between the p-bonding layer 204 and the protective layer 400 reduces. Meanwhile, if the film thickness of the p-protective adhesion layer 205 exceeds 50 nm, operation time in an etching step becomes longer and the cost of manufacturing the semiconductor light emitting element 1 increases. In this specific example, the film thickness of the p-protective adhesion layer 205 is 15 nm.

In the present exemplary embodiment, the p-third diffusion barrier layer 203c is laminated so as to cover the peripheries of the p-adhesion layer 201, the p-metal reflection layer 202, the p-first diffusion barrier layer 203a and the p-second diffusion barrier layer 203b (including the side surfaces thereof); the p-bonding layer 204 is laminated so as to cover the periphery of the p-third diffusion barrier layer 203c (including the side surface thereof); and further the p-protective adhesion layer 205 is laminated except for the above-mentioned partial region so as to cover the periphery of the p-bonding layer 204 (including the side surface thereof). Additionally, the protective layer 400 is laminated on the transparent conductive layer 170 and the transparent insulating layer 180 except for the above-mentioned partial region so as to cover the periphery of the p-electrode 200.

<N-Electrode>

Figure 4:
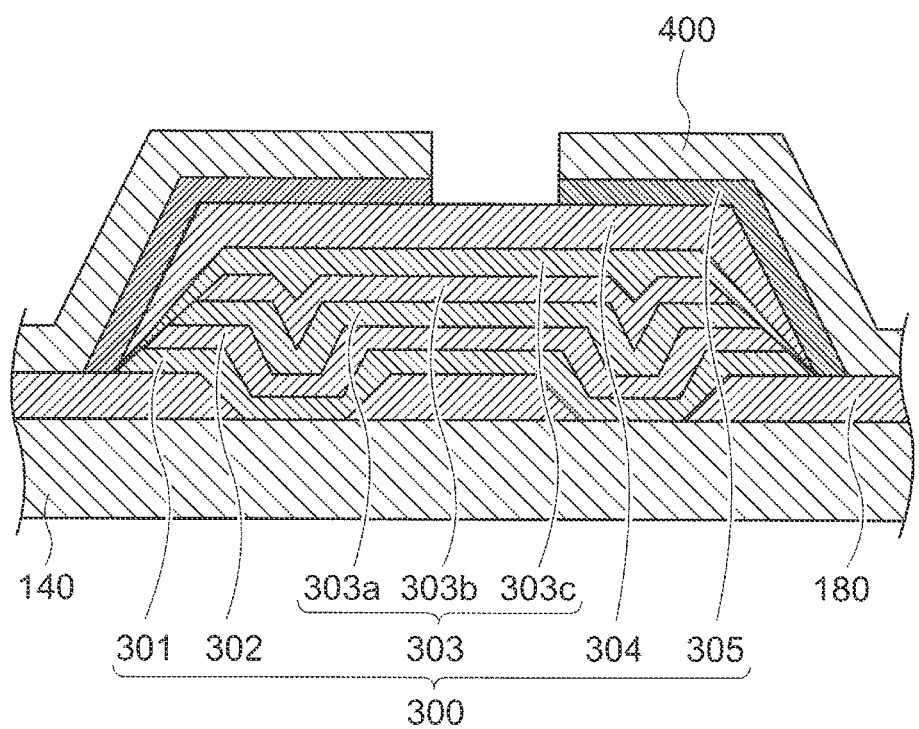
FIG. 4 is a diagram showing an exemplary cross-sectional structure around the n-electrode in the semiconductor light emitting element.

FIG. 4 is a diagram showing an exemplary cross-sectional structure around the n-electrode 300 in the semiconductor light emitting element 1 of the present exemplary embodiment. FIG. 4 shows enlargement of the cross section around the n-electrode 300 in FIG. 2.

The n-electrode 300, which is an example of a first electrode, includes: an n-adhesion layer 301 laminated so as to be in contact with the n-type semiconductor layer 140 and the transparent insulating layer 180 on the side closest to the n-type semiconductor layer 140 and the transparent insulating layer 180; an n-metal reflection layer 302 laminated on the n-adhesion layer 301; an n-diffusion barrier layer 303 laminated on the n-metal reflection layer 302; an n-bonding layer 304 laminated on the n-diffusion barrier layer 303; and an n-protective adhesion layer 305 laminated on the n-bonding layer 304. On the n-protective adhesion layer 305, the protective layer 400 is further laminated. In the present exemplary embodiment, the n-adhesion layer 301, the n-metal reflection layer 302, the n-diffusion barrier layer 303, the n-bonding layer 304 and the n-protective adhesion layer 305 configure the n-electrode 300 in which the n-pad portion 320 and the n-conductor portion 310 including the plural n-connecting conductors 311 are integrated.

Hereinafter, a description is given of each component of the n-electrode 300 of the present exemplary embodiment.

[N-Adhesion Layer]

As shown in FIG. 4, the n-adhesion layer 301 is laminated on the transparent insulating layer 180 and the n-type semiconductor layer 140 that is exposed via the through-holes provided for the transparent insulating layer 180. On the n-adhesion layer 301, the n-metal reflection layer 302 is further laminated. The n-adhesion layer 301 is provided for the purpose of enhancing physical adhesion of the materials composing these three layers and obtaining that ohmic contact with the n-type semiconductor layer 140 which has a low contact resistance.

In the semiconductor light emitting element 1 of the present exemplary embodiment, that portion of the light emitted from the light emitting layer 150 which enters the n-electrode 300 is reflected toward the substrate 110 through the transparent insulating layer 180, the n-metal reflection layer 302 and the like. Thus, it is preferable to use, as the n-adhesion layer 301, a material having excellent light transparency or a material hardly absorbing light and having high light reflectivity. Furthermore, in order to diffuse a current from the n-electrode 300 to the n-type semiconductor layer 140, it is preferable to use, as the n-adhesion layer 301, a material having excellent conductivity, a narrow resistance distribution in the surface direction and a suppressed contact resistance between the n-type semiconductor layer 140 and the n-adhesion layer 301.

In these respects, a transparent conductive layer is preferably used as the n-adhesion layer 301. In this specific example, a metal thin film made of a metal that has conductivity and light transparency and is formed extremely thin is used as the n-adhesion layer 301. In the present exemplary embodiment, the n-adhesion layer 301 is composed of titanium. However, a transparent conductive layer made of a metal oxide may be used similarly to the above-described p-adhesion layer 201. If the n-metal reflection layer 302 is composed of a material that operates similarly to the n-adhesion layer 301, the n-adhesion layer 301 can be omitted.

The film thickness of the n-adhesion layer 301 is preferably selected from the range of 1 nm to 50 nm because of the above-described reasons. If the film thickness of the n-adhesion layer 301 is less than 1 nm, adhesion to the n-type semiconductor layer 140 may be reduced to increase the contact resistance. On the other hand, if the film thickness of the n-adhesion layer 301 exceeds 50 nm, light transparency reduces and the resistance in the thickness direction (the serial resistance) increases, causing the forward voltage Vf of the obtained semiconductor light emitting element 1 to increase. In this specific example, the film thickness of the n-adhesion layer 301 is 2 nm, for example.

[N-Metal Reflection Layer]

As shown in FIG. 4, the n-metal reflection layer 302 is laminated on the n-adhesion layer 301. On the n-metal reflection layer 302, the n-diffusion barrier layer 303 is further laminated. The n-metal reflection layer 302 is provided for the purpose of reflecting, toward the substrate 110, light that is emitted from the light emitting layer 150 and that has passed through the n-type semiconductor layer 140 and the transparent insulating layer 180 along with internal reflection and the like. In the present exemplary embodiment, the transparent insulating layer 180 and the n-metal reflection layer 302 are arranged with the n-adhesion layer 301 interposed therebetween, resulting in a structure in which the transparent insulating layer 180 and the n-metal reflection layer 302 do not directly come into contact with each other. Since the n-metal reflection layer 302 is one of the components of the n-electrode 300, it is preferable to use, as the n-metal reflection layer 302, one having a low self-resistance and a suppressed contact resistance between the n-adhesion layer 301 and the n-metal reflection layer 302.

The n-metal reflection layer 302 of the present exemplary embodiment is composed of a metal, such as aluminum, palladium, copper, nickel, silver, gold and platinum, and an alloy containing at least one of these. In particular, it is preferable to use an aluminum alloy as the n-metal reflection layer 302 in that the contact resistance between the n-type semiconductor layer 140 and the n-metal reflection layer 302 with the n-adhesion layer 301 interposed therebetween can be suppressed.

If aluminum or an aluminum alloy is used as the n-metal reflection layer 302, it is preferable to use, as the n-adhesion layer 301, a metal thin-film material such as titanium that has light transparency and a low contact resistance between the n-type semiconductor layer 140 and the n-adhesion layer 301. If the n-metal reflection layer 302 is directly laminated on the transparent insulating layer 180 without providing the n-adhesion layer 301, adhesion is considerably reduced as compared with a case in which the n-adhesion layer 301 is provided.

The film thickness of the n-metal reflection layer 302 is preferably selected from the range of 80 nm to 200 nm. If the film thickness of the n-metal reflection layer 302 is less than 80 nm, the light reflectance arising from the n-metal reflection layer 302 reduces. Meanwhile, if the film thickness of the n-metal reflection layer 302 exceeds 200 nm, the cost of manufacturing the semiconductor light emitting element 1 increases. In this specific example, the film thickness of the n-metal reflection layer 302 is 100 nm.

[N-Diffusion Barrier Layer]

As shown in FIG. 4, the n-diffusion barrier layer 303 is laminated on the n-metal reflection layer 302. On the n-diffusion barrier layer 303, the n-bonding layer 304 is further laminated. The n-diffusion barrier layer 303 is provided for the purpose of preventing diffusion of the metal (an aluminum alloy in this specific example) composing the n-metal reflection layer 302, which is in contact with the n-diffusion barrier layer 303, and the metal (gold in this specific example (details thereof will be described later)) composing the n-bonding layer 304, which is in contact with the n-diffusion barrier layer 303. In the present exemplary embodiment, the n-metal reflection layer 302 and the n-bonding layer 304 are arranged with the n-diffusion barrier layer 303 interposed therebetween, resulting in a structure in which the n-metal reflection layer 302 and the n-bonding layer 304 do not directly come into contact with each other. Since the n-diffusion barrier layer 303 is one of the components of the n-electrode 300, it is preferable to use, as the n-diffusion barrier layer 303, one having a low self-resistance and suppressed contact resistances between the n-diffusion barrier layer 303 and the n-metal reflection layer 302 and between the n-diffusion barrier layer 303 and the n-bonding layer 304. Note that the n-diffusion barrier layer 303 needs not have light transparency unlike the above-described n-adhesion layer 301, because the n-diffusion barrier layer 303 is not basically required to have a function of transmitting the light from the light emitting layer 150. It is desirable to use, for the n-diffusion barrier layer 303, a metal that is stable at a high temperature and has a high melting point, such as titanium, tantalum, tungsten, molybdenum, chromium, platinum, palladium and nickel. The n-diffusion barrier layer 303 may be configured with a single layer. However, if there is no suitable material that gives favorable adhesion to both the n-metal reflection layer 302 and the n-bonding layer 304 and that is not alloyed with these layers, it is desirable to use a multilayer structure as will be described below.

The n-diffusion barrier layer 303 of the present exemplary embodiment includes: an n-first diffusion barrier layer 303a laminated on the n-metal reflection layer 302; an n-second diffusion barrier layer 303b laminated on the n-first diffusion barrier layer 303a; and an n-third diffusion barrier layer 303c laminated on the n-second diffusion barrier layer 303b. On the n-third diffusion barrier layer 303c, the n-bonding layer 304 is further laminated.

In the present exemplary embodiment, the n-first diffusion barrier layer 303a and the p-first diffusion barrier layer 203a are composed of the same material and have the same thickness; the n-second diffusion barrier layer 303b and the p-second diffusion barrier layer 203b are composed of the same material and have the same thickness; and the n-third diffusion barrier layer 303c and the p-third diffusion barrier layer 203c are composed of the same material and have the same thickness.

The n-first diffusion barrier layer 303a and the n-second diffusion barrier layer 303b have a function of preventing not only diffusion of the metal (an aluminum alloy in this specific example) composing the above-described n-metal reflection layer 302 but also diffusion of the metal (platinum in this specific example) composing the n-third diffusion barrier layer 303c. Meanwhile, the n-third diffusion barrier layer 303c has a function of preventing not only diffusion of the metal (gold in this specific example) composing the above-described n-bonding layer 304 but also diffusion of the metal (titanium in this specific example) composing the n-second diffusion barrier layer 303b.

[N-Bonding Layer]

As shown in FIG. 4, the n-bonding layer 304 is laminated on the n-diffusion barrier layer 303. On the n-bonding layer 304, the n-protective adhesion layer 305 is laminated except for a partial region that is finally exposed to the outside. The n-bonding layer 304 is provided for the purpose of feeding the n-electrode 300 by being electrically connected to the outside. In the present exemplary embodiment, the n-metal reflection layer 302 and the n-bonding layer 304 are arranged with the n-diffusion barrier layer 303 interposed therebetween, resulting in a structure in which the n-metal reflection layer 302 and the n-bonding layer 304 do not directly come into contact with each other. Since the n-bonding layer 304 is one of the components of the n-electrode 300, it is preferable to use, as the n-bonding layer 304, one having a low self-resistance and a suppressed contact resistance between the n-diffusion barrier layer 303 and the n-bonding layer 304. Note that, similarly to the n-diffusion barrier layer 303, the n-bonding layer 304 needs not have light transparency because the n-bonding layer 304 is not basically required to have a function of transmitting the light from the light emitting layer 150.

In the present exemplary embodiment, the n-bonding layer 304 and the p-bonding layer 204 are composed of the same material and have the same thickness.

[N-Protective Adhesion Layer]

As shown in FIG. 4, the n-protective adhesion layer 305 is laminated on the n-bonding layer 304 except for the partial region thereof that is finally exposed to the outside. On the n-protective adhesion layer 305, the protective layer 400 is further laminated. The n-protective adhesion layer 305 is provided for the purpose of enhancing physical adhesion of the materials composing these two layers.

In the present exemplary embodiment, the n-protective adhesion layer 305 and the p-protective adhesion layer 205 are composed of the same material and have the same thickness.

In the present exemplary embodiment, the n-third diffusion barrier layer 303c is laminated so as to cover the peripheries of the n-adhesion layer 301, the n-metal reflection layer 302, the n-first diffusion barrier layer 303a and the n-second diffusion barrier layer 303b (including the side surfaces thereof); the n-bonding layer 304 is laminated so as to cover the periphery of the n-third diffusion barrier layer 303c (including the side surface thereof); and further the n-protective adhesion layer 305 is laminated except for the above-mentioned partial region so as to cover the periphery of the n-bonding layer 304 (including the side surface thereof). Additionally, the protective layer 400 is laminated on the n-type semiconductor layer 140 and the transparent insulating layer 180 except for the above-mentioned partial region so as to cover the periphery of the n-electrode 300.

The p-diffusion barrier layer 203 and the n-diffusion barrier layer 303 have a three-layer configuration in the present exemplary embodiment; however, the number of these composition layers may be changed in design as appropriate.

Subsequently, a detailed description is given of the shape of each through-hole provided for the transparent insulating layer 180, the relationship between the through-holes and the p-electrode 200, and the relationship between the through-holes and the n-electrode 300.

Figure 5A:
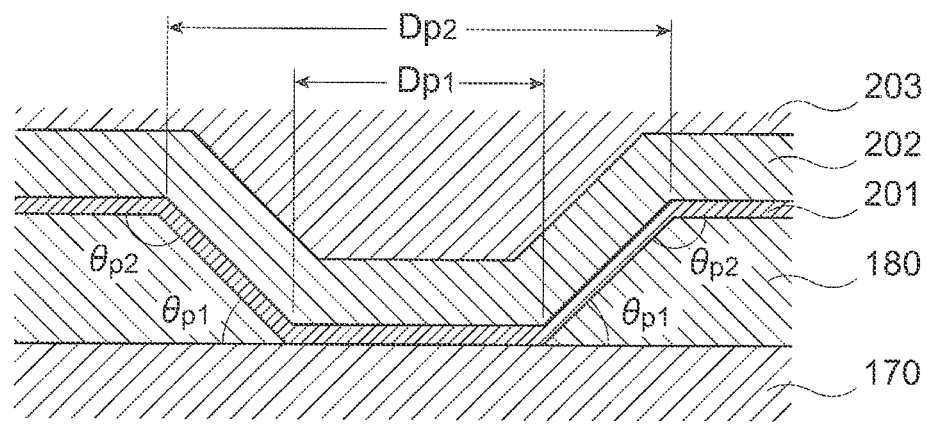
FIG. 5A is a cross-sectional view showing an exemplary boundary structure between the transparent conductive layer and the transparent insulating layer and the p-electrode around one through-hole provided for the transparent insulating layer on the p-electrode side.
Figure 5B:
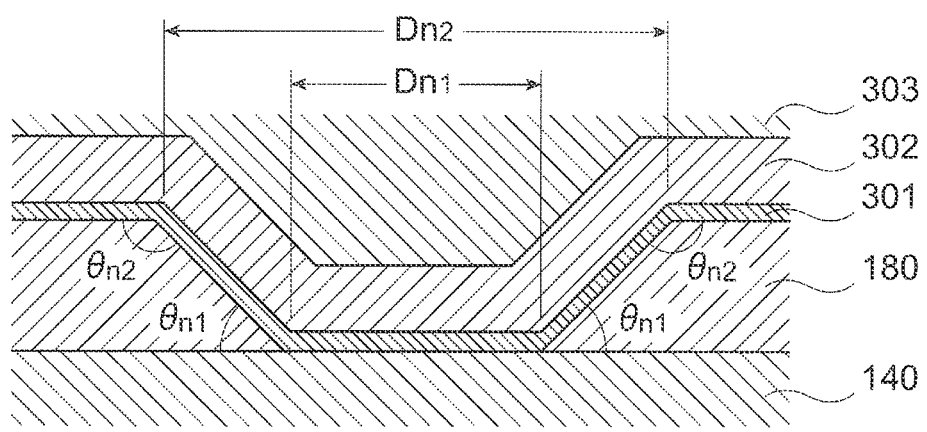
FIG. 5B is a cross-sectional view showing an exemplary boundary structure between the n-type semiconductor layer and the transparent insulating layer and the n-electrode around one through-hole provided for the transparent insulating layer on the n-electrode side.

FIG. 5A is a cross-sectional view showing an exemplary boundary structure between the transparent conductive layer 170 and the transparent insulating layer 180 and the p-electrode 200 (only the p-adhesion layer 201, the p-metal reflection layer 202 and the p-diffusion barrier layer 203 are shown here) around one through-hole provided for the transparent insulating layer 180 on the p-electrode 200 side. FIG. 5B is a cross-sectional view showing an exemplary boundary structure between the n-type semiconductor layer 140 and the transparent insulating layer 180 and the n-electrode 300 (only the n-adhesion layer 301, the n-metal reflection layer 302 and the n-diffusion barrier layer 303 are shown here) around one through-hole provided for the transparent insulating layer 180 on the n-electrode 300 side. FIG. 5A is an enlargement of an essential part of FIG. 3, while FIG. 5B is an enlargement of an essential part of FIG. 4.

First, with reference to FIG. 5A, a description is given of the boundary structure on the p-electrode 200 side. In the present exemplary embodiment, the top surface of the transparent conductive layer 170, namely, the surface on which the transparent insulating layer 180 and the like are laminated has a substantially flat cross-sectional shape. After the transparent insulating layer 180 is laminated on the top surface of the transparent conductive layer 170 so as to be substantially flat, the through-holes are formed at target positions thereof by etching or the like.

As described above, in the present exemplary embodiment, each of the through-holes formed by penetrating the transparent insulating layer 180 in the thickness direction thereof has a circular shape as seen from above, and further has a so-called tapered cross section such that the diameter of the through-hole decreases along with a move from the p-electrode 200 side to the transparent conductive layer 170. Accordingly, if the diameter of an opening (one opening) of a through-hole on the transparent conductive layer 170 side is denoted by p-first diameter Dp1 and that of the opening (the other opening) of the through-hole opposite to the transparent conductive layer 170 is denoted by p-second diameter Dp2, both the diameters have a relationship of Dp1<Dp2.

Let p-first inclination angle θp1 denote an angle formed between: a contact surface of the transparent insulating layer 180 with the transparent conductive layer 170; and that region of the inner wall surface of a through-hole provided for the transparent insulating layer 180 which is in contact with the transparent conductive layer 170. Additionally, let p-second inclination angle θp2 denote an angle formed between: a surface of the transparent insulating layer 180 opposite to the contact surface; and that region of the inner wall surface of the through-hole provided for the transparent insulating layer 180 which is in contact with this opposite surface. In the present exemplary embodiment, both the angles have a relationship of θp1<θp2. Furthermore, the p-first inclination angle θp1 is an acute angle, while the p-second inclination angle θp2 is an obtuse angle.

In the present exemplary embodiment, since the film thickness of the p-adhesion layer 201 is considerably thin as compared with the film thickness H of the transparent insulating layer 180, the p-adhesion layer 201 is laminated along the top surface of the transparent insulating layer 180, the inner wall surfaces of the through-holes provided for the transparent insulating layer 180, and the top surface of the transparent conductive layer 170 located at the bottoms of the through-holes. Accordingly, the p-adhesion layer 201 is bent on the one opening side and the other opening side of each of the through-holes provided for the transparent insulating layer 180. Each of the angles formed by the respective bent portions of the p-adhesion layer 201 is an obtuse angle.

Additionally, in the present exemplary embodiment, the p-metal reflection layer 202 laminated on the p-adhesion layer 201 is also bent along the p-adhesion layer 201. Each of the angles formed by the respective bent portions of the p-metal reflection layer 202 is also an obtuse angle. Furthermore, since the p-diffusion barrier layer 203, the p-bonding layer 204 and the like laminated on the p-metal reflection layer 202 are also affected by the through-holes provided for the transparent insulating layer 180, each of these layers have unevenness.

Next, with reference to FIG. 5B, a description is given of the boundary structure on the n-electrode 300 side. In the present exemplary embodiment, the top surface 140c of the n-type semiconductor layer 140, namely, the surface on which the transparent insulating layer 180 and the like are laminated has a substantially flat cross-sectional shape. After the transparent insulating layer 180 is laminated on the top surface 140c of the n-type semiconductor layer 140 so as to be substantially flat, the through-holes are formed at target positions thereof by etching or the like.

As described above, in the present exemplary embodiment, each of the through-holes formed by penetrating the transparent insulating layer 180 in the thickness direction thereof has a circular shape as seen from above, and further has a so-called tapered cross section such that the diameter of the through-hole decreases along with a move from the n-electrode 300 side to the n-type semiconductor layer 140. Accordingly, if the diameter of an opening (one opening) of a through-hole on the n-type semiconductor layer 140 side is denoted by n-first diameter Dn1 and that of the opening (the other opening) of the through-hole opposite to the n-type semiconductor layer 140 is denoted by n-second diameter Dn2, both the diameters have a relationship of Dn1<Dn2.

Let n-first inclination angle θn1 denote an angle formed between: a contact surface of the transparent insulating layer 180 with the n-type semiconductor layer 140; and that region of the inner wall surface of a through-hole provided for the transparent insulating layer 180 which is in contact with the n-type semiconductor layer 140. Additionally, let n-second inclination angle θn2 denote an angle formed between: a surface of the transparent insulating layer 180 opposite to the contact surface; and that region of the inner wall surface of the through-hole provided for the transparent insulating layer 180 which is in contact with this opposite surface. In the present exemplary embodiment, both the angles have a relationship of θn1<θn2. Furthermore, the n-first inclination angle θn1 is an acute angle, while the n-second inclination angle θn2 is an obtuse angle.

Note that, in the present exemplary embodiment, the plural through-holes provided for the transparent insulating layer 180 have the common shape and size, and thus Dp1=Dn1, Dp2=Dn2, θp1=θn1 and θp2=θn2.

In the present exemplary embodiment, since the film thickness of the n-adhesion layer 301 is considerably thin as compared with the film thickness H of the transparent insulating layer 180, the n-adhesion layer 301 is laminated along the top surface of the transparent insulating layer 180, the inner wall surfaces of the through-holes provided for the transparent insulating layer 180, and the top surface 140c of the n-type semiconductor layer 140 located at the bottoms of the through-holes. Accordingly, the n-adhesion layer 301 is bent on the one opening side and the other opening side of each of the through-holes provided for the transparent insulating layer 180. Each of the angles formed by the respective bent portions of the n-adhesion layer 301 is an obtuse angle. Since the electrode structure including thin films as in the present exemplary embodiment is likely to have a rip of the thin films at the bent regions (cracks are likely to occur), employing such a tapered structure has a great effect.

Additionally, in the present exemplary embodiment, the n-metal reflection layer 302 laminated on the n-adhesion layer 301 is also bent along the n-adhesion layer 301. Each of the angles formed by the respective bent portions of the n-metal reflection layer 302 is also an obtuse angle. Furthermore, since the n-diffusion barrier layer 303, the n-bonding layer 304 and the like laminated on the n-metal reflection layer 302 are also affected by the through-holes provided for the transparent insulating layer 180, each of these layers have unevenness.

Next, an exemplary method for manufacturing the above-described semiconductor light emitting element 1 is briefly described.

In manufacturing the semiconductor light emitting element 1 shown in FIGS. 1, 2 and the like, first of all, the intermediate layer 120, the base layer 130, the n-type semiconductor layer 140, the light emitting layer 150, the p-type semiconductor layer 160 and the transparent conductive layer 170 are sequentially laminated on one surface of the substrate 110 by a known method of film formation. Subsequently, a partial region (in this specific example, one region of four corners as seen from above) of the transparent conductive layer 170, the p-type semiconductor layer 160, the light emitting layer 150 and the n-type semiconductor layer 140 that have been laminated is removed by a known lithography method and a known etching method, thereby to expose the top surface 140c of the n-type semiconductor layer 140. Then, the transparent insulating layer 180 is laminated by a known method of film formation so as to cover the transparent conductive layer 170 and the top surface 140c of the n-type semiconductor layer 140. After that, plural through-holes are formed in the transparent insulating layer 180 by a known lithography method and a known etching method. On this occasion, the plural through-holes formed in the transparent insulating layer 180 have the cross-sectional shape shown in the FIGS. 5A and 5B described above. In forming the through-holes having such a tapered shape, it is desirable to employ a dry etching method that allows for easy shape control.

Then, the p-electrode 200 is formed on the transparent insulating layer 180 located on the transparent conductive layer 170, while the n-electrode 300 is formed on the transparent insulating layer 180 located on the n-type semiconductor layer 140. In forming the p-electrode 200, the p-adhesion layer 201 is laminated by a known technique of film formation on the transparent insulating layer 180 and the transparent conductive layer 170 that is exposed to the outside via the plural through-holes formed in the transparent insulating layer 180. Then, the p-metal reflection layer 202, the p-diffusion barrier layer 203 (the p-first diffusion barrier layer 203a, the p-second diffusion barrier layer 203b and the p-third diffusion barrier layer 203c), the p-bonding layer 204 and the p-protective adhesion layer 205 are further laminated by a known technique of film formation. On the other hand, in forming the n-electrode 300, the n-adhesion layer 301 is first laminated by a known technique of film formation on the transparent insulating layer 180 and the n-type semiconductor layer 140 that is exposed to the outside via the plural through-holes formed in the transparent insulating layer 180. Then, the n-metal reflection layer 302, the n-diffusion barrier layer 303 (the n-first diffusion barrier layer 303a, the n-second diffusion barrier layer 303b and the n-third diffusion barrier layer 303c), the n-bonding layer 304 and the n-protective adhesion layer 305 are further laminated by a known technique of film formation. Note that, in the present exemplary embodiment, the p-diffusion barrier layer 203, the p-bonding layer 204 and the p-protective adhesion layer 205 in the p-electrode 200 have the same configurations as the n-diffusion barrier layer 303, the n-bonding layer 304 and the n-protective adhesion layer 305 in the n-electrode 300, respectively. For the reason, after lamination of the p-adhesion layer 201 and the p-metal reflection layer 202 composing the p-electrode 200 and lamination of the n-adhesion layer 301 and the n-metal reflection layer 302 composing the n-electrode 300 are performed in different steps, lamination of the p-diffusion barrier layer 203 and the n-diffusion barrier layer 303, lamination of the p-bonding layer 204 and the n-bonding layer 304, and lamination of the p-protective adhesion layer 205 and the n-protective adhesion layer 305 can be performed in the respective same steps.

After that, the protective layer 400 is laminated by using a known method of film formation so as to cover the top surface of the semiconductor light emitting element 1 including the p-electrode 200 and the n-electrode 300. Then, a roughly center portion of the protective layer 400 located on the p-electrode 200 and the p-protective adhesion layer 205 located immediately below the center portion are removed by using a known lithography technique and a known etching technique, thereby to expose a partial region of the p-bonding layer 204 of the p-electrode 200 to the outside. Meanwhile, a roughly center portion of the protective layer 400 located on the n-electrode 300 and the n-protective adhesion layer 305 located immediately below the center portion are removed by using a known lithography technique and a known etching technique, thereby to expose a partial region of the n-bonding layer 304 of the n-electrode 300 to the outside.

If the semiconductor light emitting element 1 is used by flip-chip bonding, for example, solder bumps are formed at the exposed region provided for the p-electrode 200 and the exposed region provided for the n-electrode 300, respectively. After that, if the substrate 110 is made of sapphire, for example, the back surface of the substrate 110 is subjected to a grinding process so that the substrate 110 has a thickness of 200 µm or less. Then, division into individual elements is performed by a known technique such as a laser scribing method. If necessary, the substrate 110 may be eliminated.

The semiconductor light emitting element 1 is obtained in the above-described steps.

Figure 6A:
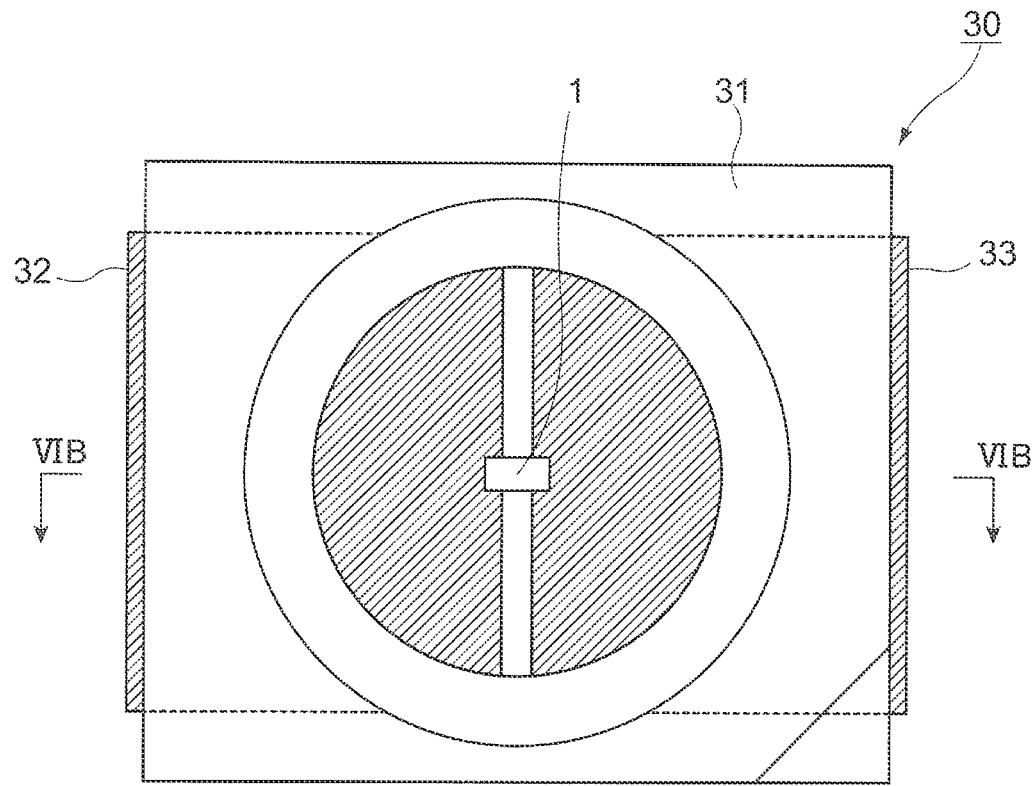
FIGS. 6A and 6B are diagrams showing an exemplary configuration of a light emitting device mounting the above-described semiconductor light emitting element.
Figure 6B:
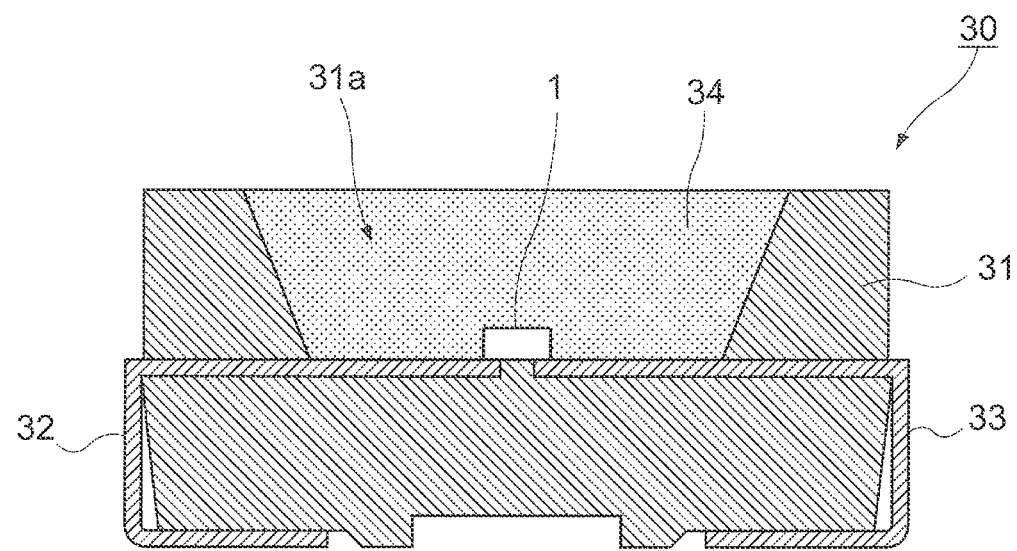

FIGS. 6A and 6B are diagrams showing an exemplary configuration of a light emitting device 30 mounting the above-described semiconductor light emitting element 1. FIG. 6A shows a top view of the light emitting device 30, while FIG. 6B is a cross-sectional view of FIG. 6A taken along the line VIB-VIB. The light emitting device 30 shown in FIGS. 6A and 6B may be referred to as "light emitting chip" or "lamp."

The light emitting device 30 includes: a housing 31 having a concave portion 31a formed on one side thereof; a p-lead portion 32 and an n-lead portion 33 that consist of a lead frame formed in the housing 31; the semiconductor light emitting element 1 attached to the bottom of the concave portion 31a; and a sealing portion 34 provided to cover the concave portion 31a. In FIG. 6A, illustration of the sealing portion 34 is omitted.

The housing 31 is formed by injection molding of white thermoplastic resin to a metal lead portion including the p-lead portion 32 and the n-lead portion 33.

The p-lead portion 32 and the n-lead portion 33 are a metal plate having a thickness of about 0.1 to 0.5 mm, and are formed by laminating several µm of nickel, titanium, gold, silver or the like as a plated layer on a base made of an alloy of iron and copper, for example, as metals having excellent formability and heat conductivity. In the present exemplary embodiment, the p-lead portion 32 and the n-lead portion 33 are partially exposed to the bottom of the concave portion 31a. Additionally, each one edge side of the p-lead portion 32 and the n-lead portion 33 is exposed to the outside of the housing 31, and is bent on an outer wall of the housing 31 to the rear surface side thereof.

The semiconductor light emitting element 1 is attached to the concave portion 31a so as to straddle the p-lead portion 32 and the n-lead portion 33. Details of a technique to attach the semiconductor light emitting element 1 to the p-lead portion 32 and the n-lead portion 33 will be described later.

The sealing portion 34 is formed of transparent resin having a high light transmittance for wavelengths in the visible region. For example, epoxy resin or silicone resin can be used as resin having characteristics of high heat resistance, weather resistance and mechanical strength for forming the sealing portion 34. In the present exemplary embodiment, transparent resin forming the sealing portion 34 contains a phosphor converting a part of light emitted from the semiconductor light emitting element 1 into green light and red light. Note that, instead of such a phosphor, the transparent resin may contain a phosphor converting a part of blue light into yellow light or a phosphor converting a part of blue light into yellow light and red light.

Electronic equipment, such as a backlight, a cellular phone, a display, various panels, a computer, a game machine and a lighting, having the light emitting device 30 of the present exemplary embodiment embedded therein and machinery, such as an automobile, having the electronic equipment embedded therein include the semiconductor light emitting element 1 having an excellent light emission property. In particular, for electronic equipment driven by a battery, such as a backlight, a cellular phone, a display, a game machine and a lighting, an excellent product that includes the semiconductor light emitting element 1 having an excellent light emission property can be produced, which is preferable. The configuration of the light emitting device 30 including the semiconductor light emitting element 1 is not limited to that shown in FIGS. 6A and 6B. For example, the light emitting device 30 may employ a package configuration referred to as bullet-shape.

FIG. 7 is a diagram showing an example how the semiconductor light emitting element 1 is mounted on the light emitting device 30 shown in FIGS. 6A and 6B. In FIG. 7, illustration of the housing 31 and the sealing portion 34 provided for the light emitting device 30 is omitted.

In the present exemplary embodiment, the semiconductor light emitting element 1 shown in FIG. 2 is turned upside down. Thereby, the exposed portion of the p-electrode 200 provided for the semiconductor light emitting element 1 is opposed to the p-lead portion 32, while the exposed portion of the n-electrode 300 provided for the semiconductor light emitting element 1 is opposed to the n-lead portion 33. The p-lead portion 32 and the exposed portion of the p-electrode 200 are connected by use of solder 35, while the n-lead portion 33 and the exposed portion of the n-electrode 300 are connected by use of solder 35. With this configuration, the semiconductor light emitting element 1 is electrically connected with the p-lead portion 32 and the n-lead portion 33, and is mechanically fixed to the housing 31 (see FIGS. 6A and 6B) through the p-lead portion 32 and the n-lead portion 33. In general, such a technique to bond the semiconductor light emitting element 1 is referred to as flip-chip bonding. In flip-chip bonding, the substrate 110 side of the semiconductor light emitting element 1 is arranged farther from the lead portions than the light emitting layer 150 thereof.

Now, with reference to FIGS. 1 to 7, a description is given of a light emitting operation performed by the light emitting device 30 shown in FIGS. 6A and 6B.

When the semiconductor light emitting element 1 is supplied with a current directed from the p-lead portion 32 to the n-lead portion 33 through the p-lead portion 32 and the n-lead portion 33 provided for the light emitting device 30, in the semiconductor light emitting element 1 a current flows from the p-electrode 200 to the n-electrode 300 through the transparent conductive layer 170, the p-type semiconductor layer 160, the light emitting layer 150 and the n-type semiconductor layer 140. As a result, the light emitting layer 150 outputs blue light, for example. On this occasion, the light outputted from the light emitting layer 150 mainly heads for the substrate 110 and the p-electrode 200.

In the present exemplary embodiment, the semiconductor light emitting element 1 is provided with the transparent insulating layer 180. Via the plural through-holes provided for the transparent insulating layer 180, the p-electrode 200 (more specifically, the plural p-connecting conductors 211) and the transparent conductive layer 170 are brought into conduction, while the n-electrode 300 (more specifically, the plural n-connecting conductors 311) and the n-type semiconductor layer 140 are brought into conduction. Thereby, the light emitting layer 150 is supplied with power.

Subsequently, a description is given of behavior of the light outputted from the light emitting layer 150 in the semiconductor light emitting element 1.

That portion of the light emitted from the light emitting layer 150 which heads for the substrate 110 mostly passes through the n-type semiconductor layer 140, the base layer 130, the intermediate layer 120 and the substrate 110, and is emitted to the outside of the semiconductor light emitting element 1 (in the upward direction of FIG. 7). However, some of the light heading for the substrate 110 is reflected, for example, on the boundary between the intermediate layer 120 and the substrate 110 due to the difference between the refractive indices of the intermediate layer 120 and the substrate 110, and turns back toward the light emitting layer 150.

On the other hand, that portion of the light emitted from the light emitting layer 150 which heads for the opposite side to the substrate 110 and some of the light that has turned back from the substrate 110 side arrive at the boundary of the transparent insulating layer 180 on the side where the p-electrode 200 is provided (a region of the transparent insulating layer 180 in which the through-holes are not formed) through the p-type semiconductor layer 160 and the transparent conductive layer 170. Some of the light that has arrived at this boundary is reflected due to the difference between the refractive indices of the transparent conductive layer 170 and the transparent insulating layer 180, and heads for the p-type semiconductor layer 160 through the transparent conductive layer 170. Meanwhile, light that has passed through the boundary between the transparent conductive layer 170 and the transparent insulating layer 180 arrives at the boundary between the transparent insulating layer 180 and the p-electrode 200 through the transparent insulating layer 180. The light that has arrived at this boundary is reflected by the p-metal reflection layer 202 provided for the p-electrode 200, and heads for the p-type semiconductor layer 160 through the transparent insulating layer 180 and the transparent conductive layer 170.

Meanwhile, that portion of the light emitted from the light emitting layer 150 which heads for the opposite side to the substrate 110 and some of the light that has turned back from the substrate 110 side arrive at the boundary of the p-electrode 200 (a region of the through-holes formed in the transparent insulating layer 180) through the p-type semiconductor layer 160 and the transparent conductive layer 170. The light that has arrived at this boundary is reflected by the p-metal reflection layer 202 provided for the p-electrode 200, and heads for the p-type semiconductor layer 160 through the transparent conductive layer 170.

The light reflected on the p-electrode 200 side in this manner further passes through the light emitting layer 150, the n-type semiconductor layer 140, the base layer 130, the intermediate layer 120 and the substrate 110, and is emitted to the outside of the semiconductor light emitting element 1 (in the upward direction of FIG. 7).

In contrast, some of the light that has turned back from the substrate 110 side arrives at the boundary of the transparent insulating layer 180 on the side where the n-electrode 300 is provided (a region of the transparent insulating layer 180 in which the through-holes are not formed) through the n-type semiconductor layer 140. Some of the light that has arrived at this boundary is reflected due to the difference between the refractive indices of the n-type semiconductor layer 140 and the transparent insulating layer 180, and heads for the base layer 130 through the n-type semiconductor layer 140. Meanwhile, light that has passed through the boundary between the n-type semiconductor layer 140 and the transparent insulating layer 180 arrives at the boundary between the transparent insulating layer 180 and the n-electrode 300 through the transparent insulating layer 180. The light that has arrived at this boundary is reflected by the n-metal reflection layer 302 provided for the n-electrode 300, and heads for the base layer 130 through the transparent insulating layer 180 and the n-type semiconductor layer 140.

Meanwhile, some of the light that has turned back from the substrate 110 side arrives at the boundary of the n-electrode 300 (a region of the through-holes formed in the transparent insulating layer 180) through the n-type semiconductor layer 140. The light that has arrived at this boundary is reflected by the n-metal reflection layer 302 provided for the n-electrode 300, and heads for the base layer 130 through the n-type semiconductor layer 140.

The light reflected on the n-electrode 300 side in this manner further passes through the intermediate layer 120 and the substrate 110, and is emitted to the outside of the semiconductor light emitting element 1 (in the upward direction of FIG. 7).

After that, the light (blue light) outputted from the semiconductor light emitting element 1 proceeds in the sealing portion 34, namely, in the concave portion 31*a*, and is emitted to the outside from an emitting surface provided on an upper portion of the sealing portion 34 directly or after reflection on the inner wall (the bottom or the wall surfaces) of the concave portion 31*a*. However, some of light heading for the emitting surface reflects on the emitting surface, and proceeds inside of the sealing portion 34 again. During this time, in the sealing portion 34, some of the blue light is converted into green light and red light by the phosphor, and the converted green light and red light are emitted from the emitting surface to the outside together with the blue light directly or after reflection on the bottom or the wall surfaces. Accordingly, white light including the blue light, the green light and the red light is emitted from the light emitting device 30.

In the present exemplary embodiment, the semiconductor light emitting element 1 is provided with a structure for reflecting light by using the difference between the refractive index of the transparent insulating layer 180 and that of another adjacent layer (the transparent conductive layer 170 in the p-electrode 200, and the n-type semiconductor layer 140 in the n-electrode 300), and is further provided with a metal reflection layer (the p-metal reflection layer 202 in the p-electrode 200, and the n-metal reflection layer 302 in the n-electrode 300) on the transparent insulating layer 180. With this configuration, if the semiconductor light emitting element 1 is mounted by flip-chip bonding, light outputted in the direction opposite to an intended direction (the direction from the light emitting layer 150 to the substrate 110) to extract light can be reflected toward the substrate 110 more. As a result, the light extraction efficiency from the semiconductor light emitting element 1 can be improved.

In the present exemplary embodiment, the p-metal reflection layer 202 is provided in the p-electrode 200, while the n-metal reflection layer 302 is provided in the n-electrode 300. Thus, the configuration of the semiconductor light emitting element 1 can be simplified as compared with a case in which the electrodes and the metal reflection layers are separately provided, and upsizing of the semiconductor light emitting element 1 can be prevented.

In the present exemplary embodiment, since the p-metal reflection layer 202 is a component of the p-electrode 200, plural through-holes are provided for the transparent insulating layer 180 arranged between the transparent conductive layer 170 and the p-electrode 200, and the transparent conductive layer 170 and the p-electrode 200 (more specifically, the p-conductor portion 210 formed of the plural p-connecting conductors 211 provided for the p-electrode 200) are electrically connected via these plural through-holes. Then, each layer composing the p-electrode 200 has a bent region that is attributed to one opening (on the transparent conductive layer 170 side) and the other opening (on the side opposite to the transparent conductive layer 170) of each through-hole provided for the transparent insulating layer 180. At such a bent region, stress tends to be applied to each layer composing the p-electrode 200, and thus it is feared that cracks are made in each layer at this bent region.

Additionally, in the present exemplary embodiment, the p-diffusion barrier layer 203 is provided between the p-metal reflection layer 202 and the p-bonding layer 204, thereby suppressing migration of the material composing the p-metal reflection layer 202 and migration of the material composing the p-bonding layer 204. However, if the above-described cracks are made in the p-electrode 200, migration by way of the cracks is likely to occur.

In contrast, in the present exemplary embodiment, devising the shape of each through-hole formed in the transparent insulating layer 180 allows for reduction in the degree of bent in each of the layers that compose the p-electrode 200 and are laminated around the through-holes. Thus, in forming the p-electrode 200 on the transparent insulating layer 180 in which the plural through-holes are formed, the occurrence of cracks in each layer composing the p-electrode 200 can be suppressed. As a result, the occurrence of migration in the p-electrode 200 composing the semiconductor light emitting element 1 can be suppressed.

Meanwhile, in the present exemplary embodiment, since the n-metal reflection layer 302 is a component of the n-electrode 300, plural through-holes are provided for the transparent insulating layer 180 arranged between the n-type semiconductor layer 140 and the n-electrode 300, and the n-type semiconductor layer 140 and the n-electrode 300 (more specifically, the n-conductor portion 310 formed of the plural n-connecting conductors 311 provided for the n-electrode 300) are electrically connected via these plural through-holes. Then, each layer composing the n-electrode 300 has a bent region that is attributed to one opening (on the n-type semiconductor layer 140 side) and the other opening (on the side opposite to the n-type semiconductor layer 140) of each through-hole provided for the transparent insulating layer 180. At such a bent region, stress tends to be applied to each layer composing the n-electrode 300, and thus it is feared that cracks are made in each layer at this bent region.

Additionally, in the present exemplary embodiment, the n-diffusion barrier layer 303 is provided between the n-metal reflection layer 302 and the n-bonding layer 304, thereby suppressing migration of the material composing the n-metal reflection layer 302 and migration of the material composing the n-bonding layer 304. However, if the above-described cracks are made in the n-electrode 300, migration by way of the cracks is likely to occur.

In contrast, in the present exemplary embodiment, devising the shape of each through-hole formed in the transparent insulating layer 180 allows for reduction in the degree of bent in each of the layers that compose the n-electrode 300 and are laminated around the through-holes. Thus, in forming the n-electrode 300 on the transparent insulating layer 180 in which the plural through-holes are formed, the occurrence of cracks in each layer composing the n-electrode 300 can be suppressed. As a result, the occurrence of migration in the n-electrode 300 composing the semiconductor light emitting element 1 can be suppressed.

In particular, in the semiconductor light emitting element 1 used by flip-chip bonding as in the present exemplary embodiment, solder bumps may be formed in advance on the p-electrode 200 and the n-electrode 300 when the semiconductor light emitting element 1 is manufactured. In many cases, a material (AuSn or the like) having a higher melting point than an ordinary solder is used for a solder bump. For this reason, when the semiconductor light emitting element 1 is mounted by flip-chip bonding, the p-electrode 200 and the n-electrode 300 tend to be subjected to stress and thermal shock due to thermal expansion and thermal contraction. In the present exemplary embodiment, the above-described structure is employed at the boundary between the plural p-connecting conductors 211 and the p-pad portion 220 in the p-electrode 200. Thus, even if the p-electrode 200 is subjected to thermal stress in mounting, cracks arising from heat are hardly made. Additionally, in the present exemplary embodiment, the above-described structure is employed at the boundary between the plural n-connecting conductors 311 and the n-pad portion 320 in the n-electrode 300. Thus, even if the n-electrode 300 is subjected to thermal stress in mounting, cracks arising from heat are hardly made.

EXAMPLES

Hereinafter, a description is given of examples of the present invention. However, the present invention is not limited to the examples.

The present inventor manufactured semiconductor light emission elements 1 that each have a different shape of the through-holes provided for the transparent insulating layer 180. In this example, GaInN, which is a sort of a group III nitride semiconductor, is used as a III-V semiconductor, and the light emission wavelength $\lambda$ thereof was set at 450 nm (blue light). Then, for each of the obtained semiconductor light emitting elements 1, an evaluation was made of the boundary structure between the p-electrode 200 and the transparent insulating layer 180 and the boundary structure between the n-electrode 300 and the transparent insulating layer 180. Here, IZO was used as the transparent conductive layer 170, and $SiO_2$ (silicon dioxide) was used as the transparent insulating layer 180. Additionally, the thickness of the transparent conductive layer 170 was set at about 250 nm, and the film thickness H of the transparent insulating layer 180 was set at 380 nm (H≈5Q).

The following Table 1 shows the p-first inclination angle $\theta p1$, the p-second inclination angle $\theta p2$, the n-first inclination angle $\theta n1$ and the n-second inclination angle $\theta n2$ of the transparent insulating layer 180 for each of Examples 1 to 4 and Comparative Example. The following Table 2 shows the layer configuration of the p-electrode 200 used in Examples 1 to 4 and Comparative Example. The following Table 3 shows the layer configuration of the n-electrode 300 used in Examples 1 to 4 and Comparative Example. Here, the layer configuration of the p-electrode 200 was the same as that of the n-electrode 300 in Examples 1 to 4 and Comparative Example. Note that "APC" shown in Table 3 is an alloy containing Ag (silver), Pd (palladium) and Cu (copper).

TABLE 1

|  | θp1 (degree) | θp2 (degree) | θn1 (degree) | θn2 (degree) |
|---|---|---|---|---|
| Example 1 | 15 | 165 | 15 | 165 |
| Example 2 | 30 | 150 | 30 | 150 |
| Example 3 | 40 | 140 | 40 | 140 |
| Example 4 | 60 | 120 | 60 | 120 |
| Comparative Example | 90 | 90 | 90 | 90 |

TABLE 2

| p-electrode 200 | | Material | Thickness (nm) |
|---|---|---|---|
| p-adhesion layer 201 | | IZO | 2 |
| p-metal reflection layer 202 | | Ag alloy (APC) | 100 |
| p-diffusion barrier layer 203 | p-first diffusion barrier layer 203a | Ta | 50 |
| | p-second diffusion barrier layer 203b | Ti | 40 |
| | p-third diffusion barrier layer 203c | Pt | 100 |
| p-bonding layer 204 | | Au | 550 |
| p-protective adhesion layer 205 | | Ta | 15 |

TABLE 3

| n-electrode 300 | | Material | Thickness (nm) |
|---|---|---|---|
| n-adhesion layer 301 | | Ti | 2 |
| n-metal reflection layer 302 | | Al alloy | 100 |
| n-diffusion barrier layer 303 | n-first diffusion barrier layer 303a | Ta | 50 |
| | n-second diffusion barrier layer 303b | Ti | 40 |
| | n-third diffusion barrier layer 303c | Pt | 100 |
| n-bonding layer 304 | | Au | 550 |
| n-protective adhesion layer 305 | | Ta | 15 |

In each of the semiconductor light emitting elements 1 of Examples 1 to 4, the boundary of the transparent insulating layer 180 and the p-electrode 200 had no cracks, and the boundary of the transparent insulating layer 180 and the n-electrode 300 had no cracks. In contrast, in the semiconductor light emitting element 1 of Comparative Example, the boundary of the transparent insulating layer 180 and the p-electrode 200 had cracks, and the boundary of the transparent insulating layer 180 and the n-electrode 300 also had cracks.

Figure 8:
FIG. 8 is a SEM photograph showing the boundary structure between the p-electrode and the transparent insulating layer in the semiconductor light emitting element according to Example 1.

FIG. 8 is a scanning electron microscope (SEM) photograph showing the boundary structure between the p-electrode 200 and the transparent insulating layer 180 in the semiconductor light emitting element 1 according to Example 1. On the other hand, FIG. 9 is a SEM photograph showing the boundary structure between the p-electrode 200 and the transparent insulating layer 180 in the semiconductor light emitting element 1 according to Comparative Example.

Referring to FIG. 8, it can be seen that the tapered cross sections of the through-holes provided for the transparent insulating layer 180 leads to smooth continuation of the layers that compose the p-electrode 200 and are laminated around the through-holes.

Figure 9:
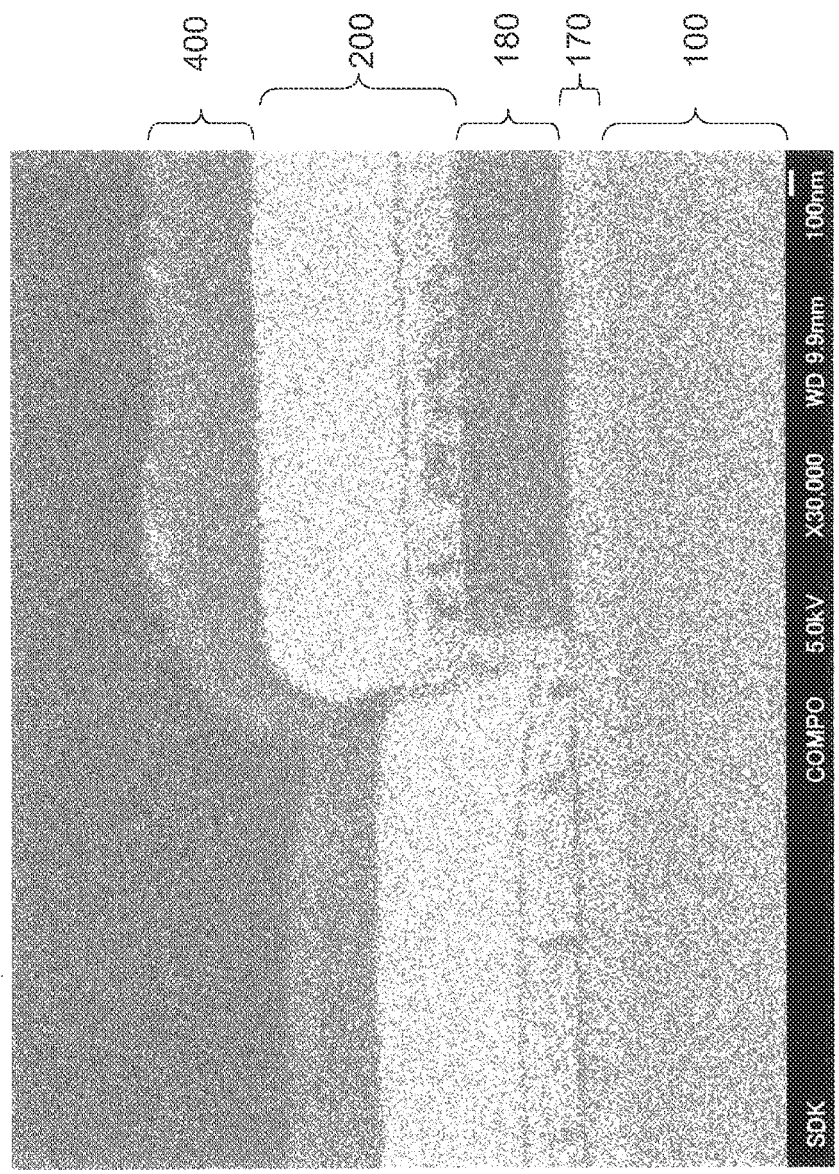
FIG. 9 is a SEM photograph showing the boundary structure between the p-electrode and the transparent insulating layer in the semiconductor light emitting element according to Comparative Example.

In contrast, referring to FIG. 9, it can be seen that if the cross sections of the through-holes provided for the transparent insulating layer 180 are not made tapered but are configured so as to rise perpendicularly to the transparent conductive layer 170 (in this example, a case where the through-holes are made cylindrical), cracks are made which correspond to the bent regions in the respective layers that compose the p-electrode 200 and are laminated around the through-holes.

In the present exemplary embodiment, the transparent insulating layer 180 having the through-holes formed therein are provided in both the p-electrode 200 and the n-electrode 300. However, the configuration is not limited thereto. It is only necessary that the transparent insulating layer 180 is provided at least on the p-electrode 200 side.

In the present exemplary embodiment, for the through-holes provided on the p-electrode 200 side and the through-holes provided on the n-electrode 300 side, the p-first diameter Dp1 and the n-first diameter Dn1 are set at the same size, and the p-second diameter Dp2 and the n-second diameter Dn2 are set at the same size. However, the configuration is not limited thereto. The size of each through-hole may be varied on the p-electrode 200 side and on the n-electrode 300 side, as long as the diameters satisfy relationships of Dp1<Dp2 and Dn1<Dn2.

Further, in the present exemplary embodiment, for the through-holes provided on the p-electrode 200 side and the through-holes provided on the n-electrode 300 side, the p-first inclination angle θp1 and the n-first inclination angle θn1 are set at the same size, and the p-second inclination angle θp2 and the n-second inclination angle θn2 are set at the same size. However, the configuration is not limited thereto. The cross-sectional shape of each through-hole may be varied on the p-electrode 200 side and on the n-electrode 300 side, as long as the angles satisfy relationships of θp1<θp2 and θn1<θn2.

Furthermore, in the present exemplary embodiment, a circular structure is employed for the through-holes provided on the p-electrode 200 side and the through-holes provided on the n-electrode 300 side. However, the configuration is not limited thereto. For example, a polygonal or an elliptic structure may be employed. If a polygonal structure is employed, it is desirable to give each corner a curvature. Further, the shape of each through-hole may be varied on the p-electrode 200 side and on the n-electrode 300 side.

If the through-holes are formed through the transparent insulating layer 180 up to the transparent conductive layer 170, the depth of digging down is desirably 10 to 50% of the thickness of the transparent conductive layer 170, and more desirably 15 to 30% thereof. If an attempt is made to form the through-holes without digging up to the transparent conductive layer 170, the transparent insulating layer 180 may remain at the bottoms of the through-holes in the regions where the through-holes are formed. If the transparent insulating layer 180 remains at the bottoms of the through-holes, the forward voltage Vf of the semiconductor light emitting element 1 increases. On the other hand, if the through-holes are formed so as to penetrate both the transparent insulating layer 180 and the transparent conductive layer 170 (a case in which the p-type semiconductor layer 160 is exposed via the through-holes), the p-adhesion layer 201 comes into contact with the p-type semiconductor layer 160 directly. In this case, since the direct contact between the p-adhesion layer 201 and the p-type semiconductor layer 160 is not an ohmic contact, a current is not directly supplied from the p-adhesion layer 201 to the p-type semiconductor layer 160, but is indirectly supplied from the transparent conductive layer 170 (the inner wall surfaces of the through-holes provided for the transparent conductive layer 170) coming into contact with the p-adhesion layer 201 through the transparent conductive layer 170 to the p-type semiconductor layer 160. Accordingly, if the through-holes provided for the transparent insulating layer

180 penetrate the transparent conductive layer 170, the contact area between the p-electrode 200 and the transparent conductive layer 170 becomes extremely small, causing the forward voltage Vf of the semiconductor light emitting element 1 to significantly increase.

Additionally, in the present exemplary embodiment, the cross-sectional shape of the inner wall surface of each through-hole is made linear for both the through-holes provided on the p-electrode 200 side and the through-holes provided on the n-electrode 300 side. However, the configuration is not limited thereto. The cross-sectional shape of the inner wall surface of each through-hole may be curvilinear, for example, or one having a step or the like, for example, as long as the p-first inclination angle θp1 or the n-first inclination angle θn 1 is an acute angle.

Furthermore, in the present exemplary embodiment, the p-second inclination angle θp2 and the n-second inclination angle θn2 are obtuse angles for both the through-holes provided on the p-electrode 200 side and the through-holes provided on the n-electrode 300 side. However, these angles are not limited thereto, but may be right angles, for example.

Still furthermore, in the present exemplary embodiment, the description has been given by taking the semiconductor light emitting element 1 including a group III nitride semiconductor as an example. However, the semiconductor light emitting element 1 is not limited thereto, but is only necessary to include a III-V semiconductor.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor light emitting element comprising:
    a first semiconductor layer composed of a III-V semiconductor having a first conductivity type;
    a light emitting layer provided on the first semiconductor layer so as to be in contact with the first semiconductor layer, the light emitting layer being composed of a III-V semiconductor and emitting light by being energized;
    a second semiconductor layer provided on the light emitting layer so as to be in contact with the light emitting layer, the second semiconductor layer being composed of a III-V semiconductor having a second conductivity type opposite to the first conductivity type;
    a transparent conductive layer composed of a material that is conductive and transparent to light outputted from the light emitting layer, the transparent conductive layer being laminated on the second semiconductor layer;
    a transparent insulating layer composed of a material that is insulative and transparent to light outputted from the light emitting layer, the transparent insulating layer having a through-hole penetrating therethrough in the thickness direction, the transparent insulating layer being laminated on the transparent conductive layer;
    a first electrode connected to the first semiconductor layer, the first electrode serving as one terminal to energize the light emitting layer; and
    a second electrode laminated on the transparent insulating layer, the second electrode being connected to the transparent conductive layer via the through-hole provided for the transparent insulating layer, the second electrode serving as the other terminal to energize the light emitting layer, wherein
    a contact surface of the transparent insulating layer with the transparent conductive layer and an inner wall surface of the through-hole provided for the transparent insulating layer form an acute angle, and
    wherein the second electrode includes:
    a first coating layer having conductivity and provided to cover the transparent insulating layer and the transparent conductive layer that is exposed via the through-hole;
    a metal reflection layer composed of a metal material that is conductive and reflective to light outputted from the light emitting layer, the metal reflection layer being provided on the first coating layer so as to be in contact with the first coating layer;
    a second coating layer provided to cover the metal reflection layer; and
    a connecting layer provided on the second coating layer so as to be in contact with the second coating layer, the connecting layer being used for electrical connection with outside.

2. The semiconductor light emitting element according to claim 1, wherein a surface of the transparent insulating layer opposite to the contact surface and the inner wall surface of the through-hole provided for the transparent insulating layer form an obtuse angle.

3. The semiconductor light emitting element according to claim 1, wherein the through-hole formed in the transparent insulating layer has a shape whose width increases from a side close to the transparent conductive layer toward a side far therefrom.

4. The semiconductor light emitting element according to claim 1, wherein the through-hole formed in the transparent insulating layer is substantially circular, and has a shape whose diameter increases from a side close to the transparent conductive layer toward a side far therefrom.

5. The semiconductor light emitting element according to claim 1, wherein the contact surface of the transparent insulating layer and the inner wall surface of the through-hole provided for the transparent insulating layer form an angle from 15 degrees to 60 degrees.

6. The semiconductor light emitting element according to claim 1, wherein the transparent insulating layer has a plurality of the through-holes formed therein.

7. The semiconductor light emitting element according to claim 1, wherein
    the transparent conductive layer is composed of a material that exhibits a first refractive index at a wavelength of light the light emitting layer outputs, and
    the transparent insulating layer is composed of a material that exhibits a second refractive index at a wavelength of light the light emitting layer outputs, the second refractive index being smaller than the first refractive index.

8. The semiconductor light emitting element according to claim 1, wherein the III-V semiconductor is made of a group III nitride semiconductor.

9. The semiconductor light emitting element according to claim 1, wherein the first electrode and the second electrode are respectively mounted with solder bumps that are used for electrical connection with outside.

10. A semiconductor light emitting element comprising:
a first semiconductor layer composed of a III-V semiconductor having a first conductivity type;
a light emitting layer provided on the first semiconductor layer so as to be in contact with the first semiconductor layer, the light emitting layer being composed of a III-V semiconductor and emitting light by being energized;
a second semiconductor layer provided on the light emitting layer so as to be in contact with the light emitting layer, the second semiconductor layer being composed of a III-V semiconductor having a second conductivity type opposite to the first conductivity type;
a transparent conductive layer composed of a material that is conductive and transparent to light outputted from the light emitting layer, the transparent conductive layer being laminated on the second semiconductor layer;
a transparent insulating layer composed of a material that is insulative and transparent to light outputted from the light emitting layer, the transparent insulating layer being laminated on the transparent conductive layer, the transparent insulating layer having a plurality of through-holes that penetrate therethrough in the thickness direction and have diameters decreasing toward the transparent conductive layer;
a first electrode connected to the first semiconductor layer, the first electrode serving as one terminal to energize the light emitting layer; and
a second electrode including
  a conductor portion having a plurality of connecting conductors that respectively have one ends connected to the transparent conductive layer via the plurality of through-holes and are respectively provided along inner wall surfaces in the plurality of through-holes, and
  an electrode portion provided on the transparent insulating layer so as to be in contact with the transparent insulating layer, the electrode portion being electrically connected with the other ends of the plurality of connecting conductors composing the conductor portion, the second electrode serving as the other terminal to energize the light emitting layer, and
wherein the second electrode further includes:
  a first coating layer having conductivity and provided to cover the transparent insulating layer and the transparent conductive layer that is exposed via the through-holes;
  a metal reflection layer composed of a metal material that is conductive and reflective to light outputted from the light emitting layer, the metal reflection layer being provided on the first coating layer so as to be in contact with the first coating layer;
  a second coating layer provided to cover the metal reflection layer; and
  a connecting layer provided on the second coating layer so as to be in contact with the second coating layer, the connecting layer being used for electrical connection with outside.

11. The semiconductor light emitting element according to claim 10, wherein
the transparent conductive layer is composed of an oxide containing indium (In),
the metal reflection layer is composed of a metal containing silver (Ag), and
the connecting layer is composed of a metal containing gold (Au).

12. The semiconductor light emitting element according to claim 10, wherein
the transparent conductive layer is composed of a material that exhibits a first refractive index at a wavelength of light the light emitting layer outputs, and
the transparent insulating layer is composed of a material that exhibits a second refractive index at a wavelength of light the light emitting layer outputs, the second refractive index being smaller than the first refractive index.

13. The semiconductor light emitting element according to claim 10, wherein the III-V semiconductor is made of a group III nitride semiconductor.

14. The semiconductor light emitting element according to claim 10, wherein the first electrode and the second electrode are respectively mounted with solder bumps that are used for electrical connection with outside.

* * * * *